United States Patent
Kikkawa et al.

(10) Patent No.: US 12,195,658 B2
(45) Date of Patent: *Jan. 14, 2025

(54) TREATMENT LIQUID FOR SEMICONDUCTOR WAFERS

(71) Applicant: TOKUYAMA CORPORATION, Yamaguchi (JP)

(72) Inventors: Yuki Kikkawa, Yamaguchi (JP); Tomoaki Sato, Yamaguchi (JP); Takafumi Shimoda, Yamaguchi (JP); Takayuki Negishi, Yamaguchi (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 203 days.

This patent is subject to a terminal disclaimer.

(21) Appl. No.: 17/636,539

(22) PCT Filed: Aug. 6, 2021

(86) PCT No.: PCT/JP2021/029371
§ 371 (c)(1),
(2) Date: Feb. 18, 2022

(87) PCT Pub. No.: WO2022/030627
PCT Pub. Date: Feb. 10, 2022

(65) Prior Publication Data
US 2022/0298416 A1    Sep. 22, 2022

(30) Foreign Application Priority Data

Aug. 7, 2020 (JP) .................. 2020-134514
Mar. 26, 2021 (JP) .................. 2021-054202

(51) Int. Cl.
*C09K 13/00* (2006.01)
*H01L 21/3213* (2006.01)

(52) U.S. Cl.
CPC ........ *C09K 13/00* (2013.01); *H01L 21/32134* (2013.01)

(58) Field of Classification Search
None
See application file for complete search history.

(56) References Cited

U.S. PATENT DOCUMENTS 11,390,829 B2 *  7/2022  Shimoda ........... H01L 21/02068
2001/0023701 A1    9/2001  Aoki et al.
(Continued)

FOREIGN PATENT DOCUMENTS

JP    2001-234373    8/2001
JP    2002-161381    6/2002
(Continued)

OTHER PUBLICATIONS

International Search Report issued Nov. 2, 2021 in International (PCT) Application No. PCT/JP2021/029371.
(Continued)

*Primary Examiner* — Shamim Ahmed
(74) *Attorney, Agent, or Firm* — Wenderoth, Lind & Ponack, L.L.P.

(57) ABSTRACT

Provided is a treatment liquid for etching a transition metal on a semiconductor wafer, the treatment liquid comprising: (A) a hypohalite ion or periodate ion; and (B) an alkylammonium salt represented by the following Formula (1).

(1)

(Continued)

(wherein a is an integer from 6 to 20, $R^1$, $R^2$, and $R^3$ are independently a hydrogen atom or an alkyl group having carbon number from 1 to 20, and $X^-$ is a bromine-containing ion), and a method of etching a transition metal by bringing the treatment liquid for semiconductor wafers into contact with the transition metal used in a semiconductor formation process.

10 Claims, 2 Drawing Sheets

(56) References Cited

U.S. PATENT DOCUMENTS

| | | |
|---|---|---|
| 2002/0060202 A1 | 5/2002 | Fukunaga et al. |
| 2005/0156140 A1 | 7/2005 | Shimizu et al. |
| 2012/0256122 A1* | 10/2012 | Sato ............... H01L 21/32134 252/79.1 |
| 2013/0302938 A1 | 11/2013 | Sato et al. |
| 2016/0130500 A1 | 5/2016 | Chen et al. |
| 2017/0222138 A1 | 8/2017 | Park et al. |
| 2018/0051237 A1* | 2/2018 | Seino ............... H01L 21/02071 |
| 2018/0087006 A1* | 3/2018 | Oie ................... C11D 3/042 |
| 2020/0024750 A1 | 1/2020 | Sasaki et al. |
| 2020/0190673 A1 | 6/2020 | Lippy et al. |
| 2021/0062115 A1 | 3/2021 | Shimoda et al. |

FOREIGN PATENT DOCUMENTS

| | | |
|---|---|---|
| JP | 2005-166924 | 6/2005 |
| JP | 2013-254946 | 12/2013 |
| JP | 2016-527707 | 9/2016 |
| JP | 2019- 54121 | 4/2019 |
| WO | 2011/074601 | 6/2011 |
| WO | 2016/068183 | 5/2016 |
| WO | 2018/181896 | 10/2018 |
| WO | 2019/142788 | 7/2019 |

OTHER PUBLICATIONS

Office Action issued Nov. 2, 2021, in corresponding Japanese Application No. 2021-551588, with English translation.
Office Action issued May 17, 2022 in corresponding Japanese Patent Application No. 2021-551588, with English Translation.
Office Action issued Sep. 13, 2022 in Japanese Patent Application No. 2021-551588, with English-language translation.

* cited by examiner

TREATMENT LIQUID FOR SEMICONDUCTOR WAFERS

TECHNICAL FIELD

The present invention relates to a novel treatment liquid for etching a transition metal present on a semiconductor wafer, used in a semiconductor device manufacturing process.

BACKGROUND ART

In recent years, design rules for semiconductor devices have become increasingly miniaturized, and wiring resistance is increasing. As a result of the increased wiring resistance, the high-speed operation of semiconductor devices is noticeably inhibited, and countermeasures are needed. Therefore, a wiring material with improved electromigration resistance and reduced resistance compared with conventional wiring materials is desired.

Ruthenium or tungsten, molybdenum, or chromium (hereinafter, tungsten, molybdenum, and chromium may be collectively referred to as Group 6 metals), compared to aluminum and copper, which are conventional wiring materials, are attracting attention especially as wiring materials for semiconductor devices with a design rule of 10 nm or less, because of their high electromigration resistance and the ability to reduce the resistance of wiring. Since electromigration can be prevented even when copper is used as a wiring material, ruthenium is also considered for use as a barrier metal for copper wiring, in addition to wiring material applications.

By the way, in a wiring formation process for semiconductor devices, even when ruthenium, tungsten, molybdenum, or chromium is selected as a wiring material, wiring is formed by dry etching or wet etching in the same way as in the case of conventional wiring materials. However, in the case of dry etching of these metals, there have been problems that precise etching is difficult because of in-plane non-uniformity caused by the distribution of plasma and increase or decrease of etching rate depending on the flux or energy of reactive species and ions. Therefore, wet etching has been attracting attention as a method of etching these metals more precisely.

In order to microfabricate semiconductor devices, microfabrication of ruthenium, tungsten, molybdenum, or chromium in wet etching is needed. In order to realize microfabrication of ruthenium, tungsten, molybdenum, or chromium, precise control of etching rate of these metals is needed. Furthermore, in order to realize multilayer wiring, flatness of each metal layer is essential, and flatness of metal surface after etching is also desired.

Patent Document 1 proposes, as a method of etching ruthenium film, a method of etching ruthenium film using a chemical liquid with a pH of 12 or higher and a standard redox potential of 300 mV vs. SHE (standard hydrogen electrode) or higher, specifically, a solution containing an oxygenate of a halogen such as hypochlorite, chlorite, or bromate.

Patent Document 2 proposes a method of oxidizing, dissolving, and removing ruthenium by means of an aqueous solution of pH 11 or higher containing ortho-periodic acid. Furthermore, Patent Document 3 proposes a treatment liquid for ruthenium metal with a pH of 10 to less than 12 containing a bromine-containing compound, an oxidizing agent, a base compound, and water.

Still further, Patent Document 4 proposes a cleaning method in which ruthenium is oxidized, dissolved, and removed using a removal solution containing cerium (IV) ammonium nitrate and a strong acid such as nitric acid.

Patent Document 5 proposes, as a treatment liquid used for etching tungsten from semiconductor wafers, a treatment liquid for wafers with ruthenium and tungsten containing hypochlorite ions and a solvent and having a pH of from more than 7.0 to less than 12.0 at 25° C. The document describes that the treatment liquid contains hypochlorite ions and can remove ruthenium and tungsten adhered to an end face or a back face of a semiconductor wafer.

Patent Document 6 proposes a tungsten metal removal solution containing ortho-periodic acid and water. The document describes that the removal solution can stably remove unwanted tungsten metal deposited or adhered on a semiconductor substrate.

Patent Document 7 discloses a method in which copper and molybdenum are processed with a chemical liquid containing an oxidizing agent and an acid to form wiring. Examples of the oxidizing agent include hydrogen peroxide, persulfuric acid, nitric acid, hypochlorous acid, permanganic acid, and dichromic acid. An example of etching a molybdenum film using an aqueous solution containing hydrogen peroxide and carboxylic acid as the chemical liquid is described.

RELATED ART DOCUMENTS

Patent Documents

Patent Document 1: Japanese Unexamined Patent Application Publication No. 2002-161381
Patent Document 2: WO 20161068183
Patent Document 3: WO 2011/074601
Patent Document 4: Japanese Unexamined Patent Application Publication No. 2001-234373
Patent Document 5: WO 2019/142788
Patent Document 6: Japanese Unexamined Patent Application Publication No. 2005-166924
Patent Document 7: Japanese Unexamined Patent Application Publication No. 2013-254946

SUMMARY OF THE INVENTION

Problems to be Solved by the Invention

However, according to the study of the present inventors, it was found that there is room for improvement in the conventional treatment liquids described in RELATED ART DOCUMENTS in the following aspects.

For example, the methods of etching ruthenium described in Patent Documents 1 and 4 are aimed at removing ruthenium residue adhered to the back surface or a bevel of a semiconductor substrate, and although ruthenium can be dissolved and removed, precise etching of ruthenium is not disclosed and has been difficult. It was difficult to maintain the flatness of a ruthenium surface after etching treatment, which is desired in a wiring process, with the treatment liquids described in Patent Documents 1 and 4. Furthermore, since it is difficult to precisely control the etching rate of ruthenium with the treatment liquids, it has been difficult to perform precise etching of ruthenium. Therefore, in the methods described in Patent Documents 1 and 4, it has been difficult to use the liquid as a treatment liquid for ruthenium in a process of forming wiring of semiconductor devices.

Similar to Patent Document 1, the treatment liquid described in Patent Document 2 is a treatment liquid for an etching residue containing ruthenium, and it has been difficult to maintain the flatness of ruthenium surface after etching treatment with this treatment liquid, and it has been difficult to control the etching rate of ruthenium precisely, and therefore it has been difficult to perform precise etching of ruthenium. Therefore, it has been difficult to use such a liquid in a wiring formation process where precise etching of ruthenium is needed.

In addition, the treatment liquid described in Patent Document 3 etches ruthenium used in a manufacturing process for semiconductor devices, wiring, and barrier metal configured on a substrate such as a semiconductor wafer. However, as in Patent Document 1 and Patent Document 4, the purpose is to clean a substrate such as a semiconductor wafer, and it is not for the purpose of precise etching. Therefore, when ruthenium was etched with the treatment liquid described in Patent Document 3, the flatness of ruthenium surface after etching treatment was not maintained, and precise control of the etching rate was also difficult. Therefore, it is difficult to use the treatment liquid described in Patent Document 3 in a wiring formation process where precise etching of ruthenium is needed, and there has been room for further improvement.

The tungsten treatment liquid described in Patent Document 5 is intended to remove tungsten adhered to an end face or a back face of a semiconductor wafer, and is not intended for precise etching. Likewise, the removal solution described in Patent Document 6 is also intended to stably remove unwanted tungsten metal deposited or adhered on a semiconductor substrate, and is not intended for precise etching. Therefore, when tungsten was etched with the treatment liquid described in Patent Document 5 or Patent Document 6, the flatness of the tungsten surface after the etching treatment was not maintained, and it was also difficult to precisely control the etching rate. Therefore, it was difficult to use the treatment liquid described in Patent Document 5 or Patent Document 6 in a wiring formation process where precise etching of tungsten is needed, and there was a need for further improvement.

The chemical liquid for etching molybdenum described in Patent Document 7 is a chemical liquid containing an oxidizing agent and an acid. The oxidizing agent disclosed in Examples of Patent Document 7 is hydrogen peroxide only, and there was a problem that the life of the solution was short due to self-decomposition reaction and the etching rate was not stable. There was a problem that the flatness of a molybdenum after treatment was not maintained. Therefore, it was difficult to use the treatment liquid described in Patent Document 7 in a wiring formation process where precise etching of molybdenum is needed, and further improvement was needed.

Accordingly, an object of the present invention is to provide a treatment liquid suitable for precise processing of a transition metal, which is capable of etching a transition metal present on a semiconductor wafer at an accurate etching rate and maintaining the flatness of the transition metal surface after the etching treatment.

Means for Solving the Problems

The present inventors intensively studied to solve the above-described problems. It is difficult to accurately control the etching rate and maintain the flatness of the surface of a transition metal after etching with a treatment liquid containing only hypohalite ions. Therefore, the present inventors further studied components to be added to the treatment liquid. As a result, the present inventors found that adding a specific alkylammonium salt maintains the flatness of the surface of a transition metal after an etching treatment, as well as enables the control of the etching rate, thereby completing the present invention.

In other words, the configuration of the present invention is as follows.

Aspect 1 A treatment liquid for etching a transition metal on a semiconductor wafer, the treatment liquid comprising:

(A) a hypohalite ion or periodate ion; and (B) an alkylammonium salt represented by the following Formula (1).

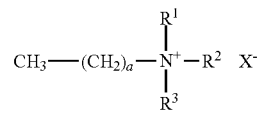

(1)

(wherein a is an integer from 6 to 20, $R^1$, $R^2$, and $R^3$ are independently a hydrogen atom or an alkyl group having carbon number from 1 to 20, and $X^-$ is a bromine-containing ion.)

Aspect 2 The treatment liquid for semiconductor waters according to Aspect 1, wherein the (A) hypohalite ion or periodate ion is a hypohalite ion.

Aspect 3 The treatment liquid for semiconductor wafers according to Aspect 1 or 2, wherein the hypohalite ion is a hypobromite ion, and the concentration of hypobromite ions is from 0.0096 to 1.92 mass %.

Aspect 4 The treatment liquid for semiconductor wafers according to Aspect 1 or 2, wherein the hypohalite ions are hypochlorite ions and hypobromite ions, and the concentration of hypochlorite ions is from 0.05 to 20.0 mass %, and the concentration of hypobromite ions is from 0.0096 to 1.92 mass %.

Aspect 5 The treatment liquid for semiconductor wafers according to any one of Aspects 1 to 4, wherein the concentration of the (B) alkylammonium salt represented by Formula (1) is from 0.0001 to 10 mass %.

Aspect 6 The treatment liquid for semiconductor wafers according to any one of Aspects 1 to 5, further containing (C) at least one ammonium ion selected from the group consisting of tetramethylammonium ion, ethykrimethylammonium ion, tetraethylammonium ion, tetrapropylammonium ion, and tetrabutylammonium ion.

Aspect 7 The treatment liquid for semiconductor wafers according to any one of Aspects 1 to 6, wherein the (A) hypohalite ion or periodate ion is a hypohalite ion, and the pH at 25° C. is from more than 7 to less than 14.0.

Aspect 8 The treatment liquid for semiconductor wafers according to any one of Aspects 1 to 7, wherein the transition metal on the semiconductor wafer is a Group 6 metal or ruthenium.

Aspect 9 The treatment liquid for semiconductor wafers according to any one of Aspects 1 to 8, further containing chloride ions.

Aspect 10 The treatment liquid for semiconductor wafers according to any one of Aspects 1 to 9, further containing chlorate ions.

Aspect 11 The treatment liquid for semiconductor wafers according to any one of Aspects 1 to 10, wherein the concentration of metal contained in the treatment liquid for semiconductor wafers is 1 ppb or less by mass.

Aspect 12 An etching method comprising a step of bringing a semiconductor wafer into contact with the treatment liquid for semiconductor wafers according to any one of Aspects 1 to 10.

Aspect 13 A chemical liquid for semiconductor wafers containing the following (A), (B), and (C).

(A) at least one ammonium salt selected from the group consisting of tetramethylammonium bromide, ethyltrimethylammonium bromide, tetraethylammonium bromide, tetrapropylammonium bromide, and tetrabutylammonium bromide, (B) an alkylammonium salt represented by the following Formula (1), and (C) a metal whose concentration is 1 ppb or less by mass.

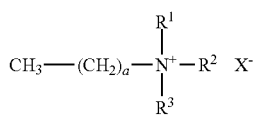

(1)

(wherein a is an integer from 6 to 20, $R^1$, $R^2$, and $R^3$ are independently a hydrogen atom or an alkyl group having carbon number from 1 to 20, and $X^-$ is a bromine-containing ion).

Aspect 14 A method for manufacturing chemical liquids for semiconductor wafers, the method comprising a step of mixing: (A) a chemical liquid containing at least one ammonium salt selected from the group consisting of tetramethylammonium bromide, ethyltrimethylammonium bromide, tetraethylammonium bromide, tetrapropylammonium bromide, and tetrabutylammonium bromide; and (B) an alkylammonium salt represented by the following Formula (1).

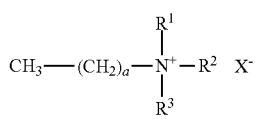

(1)

(wherein a is an integer from 6 to 20, $R^1$, $R^2$, and $R^3$ are independently a hydrogen atom or an alkyl group having carbon number from 1 to 20, and $X^-$ is a bromine-containing ion).

Aspect 15 The method for manufacturing chemical liquids for semiconductor wafers according to Aspect 14, wherein the chemical liquid for semiconductor wafers contains (C) a metal whose concentration is 1 ppb or less by mass.

Aspect 16 A method for manufacturing a solution containing tetramethylammonium bromide, ethyltrimethylammonium bromide, tetraethylammonium bromide, tetrapropylammonium bromide, or tetrabutylammonium bromide through a step of mixing tetramethylammonium hydroxide, ethyltrimethylammonium hydroxide, tetraethylammonium hydroxide, tetrapropylammonium hydroxide, or tetrabutylammonium hydroxide with a bromine-containing solution containing bromide ions or bromine-containing gas that generates bromide ions when dissolved in water.

Aspect 16 A method for manufacturing a treatment liquid for semiconductor wafers, the method comprising a step of mixing the chemical liquid for semiconductor wafers according to Aspect 13 with a solution containing hypochlorite ions.

Effect of the Invention

According to the treatment liquid for semiconductor wafers of the present invention, a transition metal can be wet etched in a process of forming semiconductor devices. Furthermore, the flatness of the surface of the transition metal after the etching treatment is maintained (less surface roughness), and the etching rate of the transition metal can be precisely controlled by the concentration of an oxidizing agent, the pH, and the type and/or the concentration of alkylammonium salt. Therefore, the treatment liquid for semiconductor wafers of the present invention can be suitably used in the case of forming a semiconductor device having a multilayer wiring structure where the flatness of each layer is demanded.

Since the treatment liquid for semiconductor wafers of the present invention has excellent flatness of the surface of a transition metal after etching treatment, the surface of the transition metal in contact with the treatment liquid can be etched uniformly without irregularity. In particular, the treatment liquid is suitable for semiconductor manufacturing where precise etching of ruthenium at several nm level is required, for example, in forming semiconductor devices with wiring structure of 10 nm or less.

The mechanism by which the treatment liquid of the present invention maintains the flatness of the surface of a transition metal, especially ruthenium or a Group 6 metal, after etching treatment is not necessarily clear, but may be considered as follows. Although the case where the transition metal is ruthenium will be described as an example, it is assumed that the surface flatness is maintained by the same mechanism for other transition metals. In other words, an alkylammonium ion contained in an alkylammonium salt in a treatment liquid is preferentially adsorbed on a more easily etched portion of the surface of ruthenium to form a protective layer. The protective layer prevents contact with hypohalite ions, which oxidize and dissolve ruthenium, thus decreasing the etching rate of the easily etched portion and resulting in uniform dissolution of ruthenium. As a result, it is considered that the flatness of the surface of the ruthenium after the etching treatment can be maintained better than the etching treatment with a treatment liquid containing only hypohalite ions. Since etching of ruthenium is partially suppressed by adsorption of alkylammonium ions on the surface of ruthenium, the amount of adsorption of alkylammonium ions can be controlled by adjusting the type and the concentration of alkylammonium ions, which is considered to enable accurate control of the etching rate of ruthenium.

Furthermore, the treatment liquid for semiconductor wafers of the present invention can etch ruthenium at an etching rate of 10 Å/min or higher. Furthermore, by controlling the concentration of an oxidizing agent, the pH, and the type and/or the concentration of an alkylammonium salt, the etching rate of ruthenium can be adjusted as desired and the amount of etching can be controlled to a desired value. In other words, the treatment liquid of the present invention is a treatment liquid that can be suitably used for precise etching of ruthenium.

Figure 1:
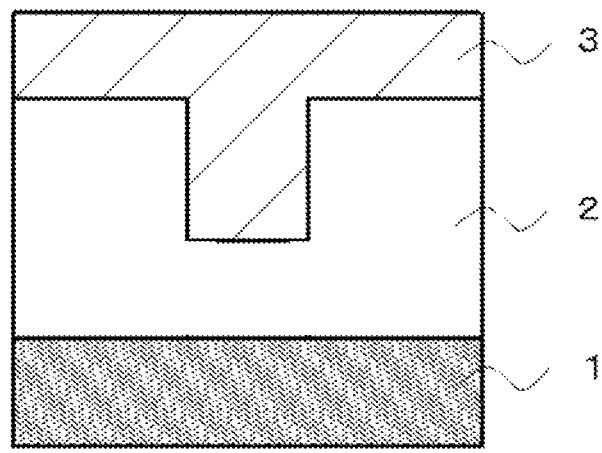
FIG. 1 is a schematic cross-sectional view of an example of a wiring formation process in which the treatment liquid of the present invention can be suitably used.

MODE FOR CARRYING OUT THE INVENTION (Treatment Liquid for Semiconductor Wafers)

The treatment liquid for semiconductor wafers (hereinafter, also referred to as "treatment liquid") of the present invention is a treatment liquid that maintains the flatness of the surface of a transition metal, especially ruthenium or a Group 6 metal, after etching treatment, and also enables precise control of the etching rate of a transition metal, especially ruthenium or a Group 6 metal. Therefore, the treatment liquid is suitable for use in a semiconductor manufacturing process, and is especially suitable for use in a wiring formation process.

A transition metal to which the treatment liquid of the present invention is applied can be deposited by any method, and is, for example, formed on a semiconductor wafer by a known method such as CVD, ALD, or sputtering in a semiconductor manufacturing process. By etching the formed transition metal with a treatment liquid, a semiconductor wiring is formed.

A transition metal contained in a wafer to be treated with the treatment liquid of the present invention is not particularly limited, and examples of such a transition metal include Ru, Rh, Ti, Ta, Co, Cr, Hf, Os, Pt, Ni, Mn, Cu, Zr, La, Mo, and W. Among them, Ru, W, Mo, or Cr can be suitably used because precise etching can be achieved and a surface with excellent flatness can be made by treatment with the treatment liquid of the present invention.

Herein, ruthenium (also referred to as "Ru") is not limited to ruthenium metal, and can be any substance that contains an element of ruthenium. That is, ruthenium metal, ruthenium alloy, ruthenium oxide, or the like is referred to as ruthenium. Tungsten (also referred to as "W") is not limited to tungsten metal, but can be used as long as it contains tungsten elements. That is, tungsten metal, tungsten alloy, tungsten oxide, or the like is referred to as tungsten. Molybdenum (also referred to as "Mo") is not limited to molybdenum metal, and can be any substance that contains molybdenum elements. That is, molybdenum metal, molybdenum alloy, molybdenum oxide, or the like is referred to as molybdenum. Chromium (also referred to as "Cr") is not limited to chromium metal, and can be any substance that contains chromium elements. That is, chromium metal, chromium alloy, chromium oxide, or the like is referred to as chromium. Herein, a Group 6 metal represent tungsten, molybdenum, or chromium in this specification.

Furthermore, the treatment liquid of the present invention is a treatment liquid that can maintain the flatness of the surface of a transition metal after etching. In the present invention, maintaining the flatness of the surface of a transition metal after etching means that the flatness of the surface of a transition metal to be etched does not substantially change before and after etching, or even if the flatness changes, the change is within a range that does not cause practical problems. Cases where the flatness of the surface of a transition metal is not maintained include, for example, not only cases where pitting corrosion occurs in a film of the transition metal or uneven etching (uneven location) occurs due to etching, but also cases where the surface roughness of the metal surface increases. The flatness of the surface of a transition metal can be easily confirmed, for example, by observing the surface of the transition metal using a scanning electron microscope (SEM) or by observing and measuring the surface using an atomic force microscope (AFM). Therefore, by observing, measuring, and comparing the surface of a wafer containing a transition metal to be etched before and after an etching process using the above-described evaluation methods, it can be easily determined whether or not the flatness of the metal surface is maintained after etching.

Figure 2:
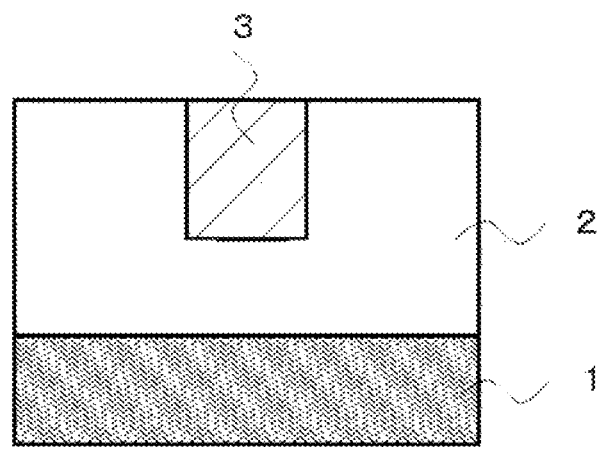
FIG. 2 is a schematic cross-sectional view of an example of a wiring formation process after treatment with the treatment liquid of the present invention.

FIGS. 1 and 2 show an example of a wiring formation process. The wiring formation process will be described using the case where the transition metal is ruthenium or a metal of Group 6 as an example.

First, a substrate 1 made of a semiconductor (for example, Si) is prepared. The prepared substrate is subjected to an oxidation treatment to form a silicon oxide film on the substrate. Then, an interlayer insulating film 2 made of a low-k film is deposited, and via holes are formed at predetermined intervals. After the formation, a transition metal 3 is embedded into the via holes by thermal CVD, and a transition metal film is further deposited (FIG. 1). The transition metal film is etched by wet etching with a treatment liquid to term transition metal wiring (FIG. 2).

The treatment liquid of the present invention contains (A) a hypohalite ion or periodate ion, and (B) an alkylammonium salt represented by the following Formula (1). The following is a step-by-step description.

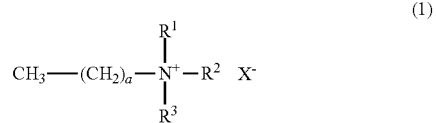

(wherein a is an integer from 6 to 20, $R^1$, $R^2$, and $R^3$ are independently a hydrogen atom or an alkyl group having carbon number from 1 to 20, and $X^-$ is a bromine-containing ion.)

(A) Hypohalite Ion and Periodate Ion

In the present invention, hypohalite ions refer to hypochlorite ions, hypobromite ions, or hypoiodite ions. These can be used singly or in a mixture. Hypohalite ions act as an oxidizing agent and etch a transition metal. The hypohalite ions used in the present invention can be added to a treatment liquid in any method, and for example, hypohalite ions can be generated in a treatment liquid by dissolving hypohalous acid salts in a solvent. In other words, hypochlorite ions can be generated by dissolving hypochlorite in a solvent, and hypobromite ions can be generated by dissolving hypobromite in a solvent. By blowing chlorine gas or bromine gas into a treatment liquid, hypochlorite ions or hypobromite ions can be generated, respectively. By adding chlorine water or bromine water to a solvent, hypochlorite ions or hypobromite ions can also be added to the treatment liquid of the present invention.

In the present invention, periodate ions refer to orthoperiodate ions, meta-periodate ions, or the like. Periodate ions act as an oxidizing agent, and etch a transition metal. Periodate ions used in the present invention can be added to a treatment liquid in any method. These can be used singly or in a mixture.

The counter ions (cations) in the above-described hypohalite ions and periodate ions are alkali metal ions, alkaline earth metal ions, and organic cations. Since alkali metal ions and alkaline earth metal ions have adverse effects on semiconductor wafers (adverse effects such as lowering the yield of semiconductor wafers) when remaining on semiconductor wafers, it is preferable that the mixing ratios of alkali metal ions and alkaline earth metal ions are small, and in fact, the ratios are preferably as low as possible. Therefore, as the counter ions, organic cations are preferable. In consideration of industrial manufacturing, the organic cation is preferably at least one ammonium ion selected from the group consisting of tetramethylammonium ion, tetraethylammonium ion, tetrapropylammonium ion, tetrabutylammonium ion, and ethyltrimethylammonium ion, and particularly preferably tetramethylammonium ion or ethyltrimethylammonium ion. Therefore, since sodium ions or calcium ions in a treatment liquid can be reduced by selecting tetramethylammonium ions or ethyltrimethylammonium ions as counter ions, it is preferable that the treatment liquid contains tetramethylammonium ions or ethyltrimethylammonium ions.

In the present invention, when the hypohalite ion is hypochlorite ion or hypoiodite ion, the concentration range of the hypochlorite ion or the concentration range of the periodate ion is preferably from 0.05 to 20 mass % with respect to the total amount of a treatment liquid. When the concentration is within the above-described range, the concentration decrease due to decomposition of hypochlorite ion or periodate ion in the treatment liquid can be suppressed (hereinafter, an effect of suppressing a decomposition reaction of hypohalite ion or periodate ion in the treatment liquid and suppressing a decrease in the concentration of the hypohalite ion or periodate ion may be referred to as favorable "storage stability"), and a transition metal can be etched at a high etching rate. When the concentration of hypochlorite ion, hypoiodite ion, or periodate ion is more than 20 mass %, the storage stability may deteriorate. When the concentration of hypochlorite ion or periodate ion is smaller than 0.05 mass %, the etching rate of a transition metal tends to be slower, and the production efficiency tends to decrease. Within the above-described concentration range, from the viewpoint of the etching rate of a transition metal and the storage stability of a treatment liquid, the concentration of hypochlorite ion, hypoiodite ion, or periodate ion is preferably from 0.05 to 20 mass %, and preferably from 0.1 to 15 mass %, more preferably from 0.3 to 10 mass %, further preferably from 0.5 to 6 mass %, and especially preferably from 0.5 to 4 mass %.

When the hypohalite ion is hypobromite ion, the concentration range is preferably from 0.0096 to 1.92 mass % with respect to the total amount of a treatment liquid. When the concentration is within the above-described range, decrease in the concentration due to decomposition of hypobromite ion in a treatment liquid can be suppressed, and a transition metal can be etched at a high etching rate. When the concentration of hypobromite ion is more than 1.92 mass %, the storage stability may deteriorate. When the concentration of hypobromite ion is smaller than 0.0096 mass %, the etching rate of transition metals tends to slow down and the production efficiency tends to decrease. Within the above-described concentration range, from the viewpoint of the etching rate of a transition metal and the storage stability of a treatment liquid, the concentration of hypobromite ion is preferably from 0.0096 to 1.92 mass %, and more preferably from 0.048 to 1.92 mass %, and further preferably from 0.096 to 0.96 mass %.

The concentration of hypohalite ion or periodate ion in the treatment liquid of the present invention can be calculated at the time of production of the treatment liquid, or can be confirmed by direct analysis of the treatment liquid. For example, the concentration of hypohalite ion or periodate ion can be determined from the absorption spectrum of hypohalite ion or periodate ion measured with an iodine titration method or a spectrophotometer.

The pH of the treatment liquid of the present invention containing hypohalite ions is preferably from greater than 7 to less than 14.0. When the pH of the treatment liquid is less than 7, a decomposition reaction of hypohalite ions tends to occur more easily, and the concentration of hypohalite ions tends to decrease. Therefore, in order to achieve the storage stability of a treatment liquid and the stability and controllability of the etching rate of a transition metal, the pH of the treatment liquid is preferably from more than 7 to less than 14.0, more preferably 8 or more and less than 14.0, further preferably 8 or more and less than 13, and most preferably 9 or more and 12.5 or less. From the viewpoint of stability in the above-described pH range, large etching rate of transition metals, and easy manufacturing of high-purity products suitable for semiconductor manufacturing, the hypohalite ion is preferably hypochlorite ion or hypobromite ion. For example, when the concentration of hypochlorite ion is within the above-described range, a treatment liquid in which the etching performance of a transition metal is sufficiently exhibited even after 15 days of storage in a dark place at 23° C. in an inert gas atmosphere can be obtained.

In the case of a treatment liquid containing periodate ions, the pH is preferably 1 or more and 14.0 or less. The preferable pH range of a treatment liquid containing periodate ion depends on a transition metal to be treated, and in cases where the transition metal is ruthenium, the pH is preferably 1 or more and 9 or less, in cases where the transition metal is tungsten, the pH is preferably 4 or more and 14 or less, in cases where the transition metal is molybdenum, the pH is preferably 6 or more and 14 or less, and in cases where the transition metal is chromium, the pH is preferably 4 or more and 14 or less. Herein, the pH is the value at 25° C. in this specification.

(B) Alkylammonium Salt

The treatment liquid of the present invention contains an alkylammonium salt.

The mechanism by which a treatment liquid of the present invention is able to maintain the flatness of the surface of a transition metal after etching treatment is considered to be as follows. That is, cations (alkylammonium ions) of alkylammonium salts contained in the treatment liquid are thought to be adsorbed on the surface of a transition metal by a polar group centered on a nitrogen atom. An alkyl group, which is a non-polar group of adsorbed cation, will be located away from the surface of a transition metal, forming a hydrophobic protective layer on the surface of the transition metal. Since the formed protective layer prevents hypohalite ions or periodate ions contained in the treatment liquid from coming into contact with the transition metal, as a result, the transition metal is etched without irregularity and evenly, and the flatness of the surface of the transition metal is maintained after the etching treatment.

An alkylammonium salt contained in the treatment liquid of the present invention is an alkylammonium salt represented by the following Formula (I).

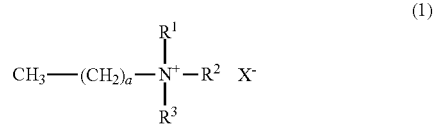

(wherein a is an integer from 6 to 20, $R^1$, $R^2$, and $R^3$ are independently a hydrogen atom or an alkyl group having carbon number from 1 to 20, and $X^-$ is a bromine-containing ion.)

The integer a in the above-described Formula (1) represents the number of methylene groups, and can be used without any restriction as long as the integer a is from 6 to 20. The integer a is preferably from 6 to 15, and the integer a is further preferably from 8 to 15. An alkylammonium salt containing a methylene group having carbon number within the above-described range can be suitably used since the salt is adsorbed on the surface of a transition metal and forms an appropriate protective layer. The larger the integer a of an alkylammonium salt, the greater the amount of alkylammonium ions of the alkylammonium salt adsorbed onto the surface of the transition metal, which tends to reduce the etching rate of the transition metal. When the integer a of the alkylammonium salt is large, the water solubility of the alkylammonium salt decreases, causing particles to be generated in a treatment liquid, which in turn reduces the yield of semiconductor devices. On the other hand, the smaller the integer a of the alkylammonium salt is, the less amount is adsorbed on the surface of the transition metal, which tends to prevent formation of an appropriate protective layer on the surface of the transition metal, and the maintenance of the flatness of the surface of the transition metal after etching treatment.

$R^1$, $R^2$, and $R^3$ in the above-described Formula (1) are independently a hydrogen atom or an alkyl group having carbon number from 1 to 20, and can be the same or different from each other. $R^1$, $R^2$, and $R^3$ are preferably alkyl groups having carbon number from 1 to 20. Furthermore, the carbon number of $R^1$, $R^2$, and $R^3$ are preferably the same as or smaller than the integer a, and any one of the groups of $R^1$, $R^2$, and $R^3$ is more preferably a methyl group. By setting any one of $R^1$, $R^2$, and $R^3$ to be a methyl group, a more even and dense protective layer is formed on the surface of a transition metal, and the flatness of the surface of the transition metal can be maintained after etching treatment.

The alkylammonium salt represented by the above-described Formula (1) contains a bromine-containing ion. Here, the bromine-containing ion is an ion that contains bromine, and examples thereof include bromite ion, bromate ion, perbromate ion, hypobromite ion, and bromide ion. When a treatment liquid contains an alkylammonium salt containing bromine-containing ions, the flatness of the surface of a transition metal after etching is improved. The reason for this is not necessarily clear, but can be considered as follows. Some or all of the alkylammonium salts dissociate in the treatment liquid, resulting in the presence of bromine-containing ions in the treatment liquid. Since these bromine-containing ions are assumed to be uniformly present on the surface of the transition metal in the treatment liquid to some extent, it is assumed that the etching rate of the transition metal by hypohalite ions or periodate ions can be controlled to some extent. Therefore, it is assumed that the surface roughness caused by etching can be suppressed by reducing the etching rate of the transition metal.

Since alkylammonium salts containing bromine-containing ions are more stable and easier to synthesize than alkylammonium salts containing chlorine-containing or fluorine-containing ions, high-purity products are industrially available at low cost. Alkylammonium salts containing bromine-containing ions have an advantage of containing more alkylammonium ions per unit weight than those containing iodine-containing ions. Therefore, the alkylammonium salt in the treatment liquid of the present invention contains bromine-containing ions.

Specific examples of the alkylammonium salt represented by Formula (1) that can be suitably used in the present invention include a bromide such as n-octyltrimethylammonium bromide, decyltrimethylammonium bromide, dodecyltrimethylammonium bromide, tetradecyltrimethylammonium bromide, hexadecyltrimethylammonium bromide, octadecyltrimethylammonium bromide, didecyldimethylammonium bromide, didodecyldimethylammonium bromide, or ethyltrimethylammonium bromide ion, a hypobromite such as n-octyltrimethylammonium hypobromite, decykrimethylammonium hypobromite, dodecyltrimethylammonium hypobromite, dodecyltrimethylammonium hypobromite, tetradecyltrimethylammonium hypobromite, hexadecyltrimethylammonium hypobromite, octadecyltrimethylammonium hypobromite, didecyldimethylammonium hypobromite, or didodecyldimethylammonium hypobromite, a bromite salt such as n-octyltrimethylammonium bromite, decyltrimethylammonium bromite, dodecyltrimethylammonium bromite, tetradecyltrimethylammonium bromite, hexadecyltrimethylammonium bromite, octadecyltrimethylammonium bromite, didecyldimethylammonium bromite, or didodecyldimethylammonium bromite, a bromate salt such as n-octyltrimethylammonium bromate, decyltrimethylammonium bromate, dodecyttrimethylammonium bromate, tetradecyltrimethylammonium bromate, hexadecyltrimethylammonium bromate, octadecyltrimethylammonium bromate, didecyldimethylammonium bromate, or didodecyldimethylammonium bromate, and a perbromate such as i-octyltrimethylammonium perbromate, decyltrimethylammonium perbromate, dodecyltrimethylammonium perbromate, tetradecyltrimethylammonium perbromate, hexadecyltrimethylammonium perbromate, octadecyltrimethylammonium perbromate, didecyldimethylammonium perbromate, or didodecyldimethylammonium perbromate.

The amount of alkylammonium salt added is preferably in the range of from 0.0001 to 10 mass % with respect to the whole treatment liquid. When the amount of alkylammonium salt added is in this range, the amount of alkylammonium ion adsorbed can be controlled by adjusting the type and the concentration of the alkylammonium ion, and the etching rate of a transition metal can be accurately controlled. Furthermore, by adjusting the type and the concentration of the alkylammonium ion, a sufficient protective layer can be formed on the surface of the transition metal, and the flatness of the surface of the transition metal can be maintained after etching treatment. When adding alkylammonium salts, only one type can be added, or more than one type can be added. Even when a plurality of types of alkylammonium salts are added, as long as the total amount of alkylammonium salts added is within the above-described range, the etching rate of the transition metal can be accurately controlled.

The treatment liquid of the present invention may contain a metal (or a metal ion, hereinafter referred to as a metal, including the case of a metal ion) derived from addition of an alkylammonium salt and in the production of the treatment liquid. Specific examples of the metal contained include lithium, sodium, potassium, aluminum, magnesium, calcium, chromium, manganese, iron, nickel, cobalt, copper, silver, cadmium, barium, zinc, and lead, and the ion thereof. However, these metals are preferably present in low amounts because they affect the stability of alkylammonium salts. The reason for this is not clear, but it is considered that the metal acts as a catalyst for decomposition of an alkyl group in alkali, promoting a decomposition reaction. On the other hand, a small amount of metal in the treatment liquid is preferable, but a small amount of metal can maintain the flatness of the surface of the metal after an etching treatment (prevent surface roughness). Therefore, the content of any one of the metals selected from the group consisting of lithium, sodium, potassium, aluminum, magnesium, calcium, chromium, manganese, iron, nickel, cobalt, copper, silver, cadmium, barium, zinc, and lead based on mass is preferably from 0.01 ppt to 1 ppb, more preferably from 1 ppt to 1 ppb, still more preferably from 10 ppt to 500 ppt, and most preferably from 100 ppt to 200 ppt. When these metals remain on a semiconductor wafer, they will have an adverse effect on the semiconductor wafer (an adverse effect such as lowering the yield of the semiconductor wafer).

When the content of the metal exceeds 1 ppb, the content of the metal can be reduced to 1 ppb or less by filtration, distillation, ion exchange, or the like.

In the treatment liquid of the present invention, the remaining component other than (A) a hypohalite ion or periodate ion, (B) an alkylammonium salt represented by Formula (1), and (C) an ammonium ion and other additives as described below, is water. The water contained in the treatment liquid of the present invention is preferably water from which metal ions, organic impurities, particles, or the like have been removed by distillation, ion exchange treatment, filter treatment, various adsorption treatments, or the like, further preferably pure water, and most preferably ultrapure water. Such water produced by a widely known method in semiconductor manufacturing can be suitably used.

(C) Ammonium Ion

When hypohalite ions are added to the treatment liquid by dissolving a hypohalilte in water or other means, counter ions of the hypohalite ions contained in the hypohalite are contained in the treatment liquid.

Here, when the above-described hypohalite is sodium hypochlorite, sodium ions are contained in the treatment liquid as counter ions, and when the above-described hypohalite is calcium hypochlorite or the like, calcium ions are contained in the treatment liquid as counter ions. Since the above-described alkali metal ions and alkaline earth metal ions such as sodium ions and calcium ions, when remaining on a semiconductor wafer, have an adverse effect on the semiconductor wafer (adverse effect such as lowering the yield of the semiconductor wafer), the amount present in a treatment liquid is preferably small, and in fact, is preferably as low as possible. Accordingly, organic ions are preferred as counter ions to hypohalite ions, and in consideration of industrial production, the (C) ammonium ion that can be contained in the treatment liquid of the present invention is preferably at least one ammonium ion selected from the group consisting of tetramethylammonium ion, ethyltrimethylammonium ion, tetraethylammonium ion, tetrapropylammonium ion, and tetrabutylammonium ion. Among these ammonium ions, tetramethylammonium ion and ethyltrimethylammonium ion are further preferable, and tetramethylammonium ion is particularly preferable since high-purity products are easily available industrially. Accordingly, it is preferable that the treatment liquid contains tetramethylammonium ions, since the sodium and calcium ions in the treatment liquid can be reduced by selecting tetramethylammonium ions as counter ions. The treatment liquid can further contain tetramethylammonium hydroxide. As described above, tetramethylammonium ion and ethyltrimethylammonium ion are preferable for ammonium ion, but from the viewpoint of safety in handling, ethyltrimethylammonium ion is preferable.

(C) The ammonium ion can be counter ion of an organic alkali added to the treatment liquid of the present invention. For example, when the organic alkali is tetramethylammonium hydroxide, ethyltrimethylammonium hydroxide, tetraethylammonium hydroxide, tetrapropylammonium hydroxide, and tetrabutylammonium hydroxide, (C) the ammonium ion can be any of the cations contained in the organic alkali, namely, tetramethylammonium ion, ethyltrimethylammonium ion, tetraethylammonium ion, tetrapropylammonium ion, and tetrabutylammonium ion.

In the present invention, the concentration range of the ammonium ion is preferably from 0.001 to 30 mass % with respect to the whole treatment liquid. When the concentration of ammonium ions satisfies this range, a treatment liquid having excellent long-term storage stability can be obtained. In order to further improve the storage stability, the concentration of ammonium ions is more preferably from 0.005 to 20 mass %, further preferably from 0.01 to 15 mass %, and particularly preferably from 0.05 to 8 mass %.

In the present invention, for example, tetramethylammonium ions can be contained in the treatment liquid by passing a tetramethylammonium hydroxide aqueous solution through an ion exchange resin, preparing an ion exchange resin that has been exchanged to a tetramethylammonium ion type, and then contacting the ion exchange resin with a solution containing hypochlorite ions to ion exchange cations contained in the solution to tetramethylammonium ions.

(Anion Species)

The treatment liquid of the present invention can contain at least one anion species selected from the group consisting of halogen acid ions, halous acid ions, and halide ions. Specific examples of the above-described anion species include halogen acid ions such as $ClO_3^-$, $BrO_3^-$, and $IO_3^-$; halous acid ions such as $ClO_2^-$, $BrO_2^-$, and $IO_2^-$; and halide ions such as $Cl^-$, $Br^-$, and $I^-$. One kind of these anion species can be contained in the treatment liquid, and two or more kinds of anion species can be contained in the treatment liquid. When two or more kinds of anion species are contained, cases in which ions with the same oxidation number of halogen atoms are contained, such as two kinds of halogen acid ions, and cases in which ions with different oxidation numbers of halogen atoms are contained, such as one kind of halous acid ion and one kind of halide ion, are both possible.

By containing anion species in the treatment liquid, the stability of the alkylammonium bromide contained in the treatment liquid can be improved. The reason for this is not certain, but when alkylammonium bromide is dissolved, bromide ions are present as counter ions to the alkylammonium ions. Due to the insufficient solubility, the alkylammonium bromide may precipitate during storage. For this reason, it is considered effective to add an anion species that exchanges counter ions with bromide ion for stabilization as alkylammonium ion in the treatment liquid.

Among these, from the viewpoint of solubility in the treatment liquid, case of availability, cost, and the like, as the above-described anion species, halogen acid ions and/or halide ions are preferably contained, and chlorate ions and/or chloride ions are more preferable.

The above-described anion species used in the present invention can be generated by dissolving an acid, a salt, or the like containing the anion species in a treatment liquid. Examples of an acid containing an anion species include a halogen acid such as chloric acid, bromic acid, or iodic acid; a halous acid such as chlorite, bromite, or iodic acid; and a hydrogen halide such as hydrogen chloride, hydrogen bromide, or hydrogen iodide. Examples of a salt containing an anion species include an alkali metal salt, an alkaline earth metal salt, and an organic salt. Specific examples of the alkali metal salt include potassium chloride, sodium chlorite, potassium bromide, sodium bromite, potassium iodide, and sodium iodate, and examples of the organic salt include an organic salt containing an onium ion such as a quaternary alkylammonium salt such as tetramethylammonium chloride, tetramethylammonium bromide, or tetramethylammonium iodide. The above-described hydrogen halides can also be generated by dissolving a halogen gas such as chlorine gas, bromine gas, or iodine gas in water. Among these, from the viewpoint of not containing metal which is a factor in yield reduction in semiconductor manufacturing, it is preferable to use an acid or organic salt containing an anion species, and from the viewpoint of ease of industrial availability and handling, it is further preferable to use an organic salt containing an onium ion such as a quaternary alkylammonium salt. Examples of organic salts that are particularly suitable for use in terms of stability, purity, and cost include tetramethylammonium chloride, tetramethylammonium bromide, tetramethylammonium iodide, ethyltrimethylammonium chloride, ethyltrimethylammonium bromide, ethyltrimethylammonium iodide, tetraethylammonium chloride, tetraethylammonium bromide, tetraethylammonium iodide, tetrapropylammonium chloride, tetrapropylammonium bromide, and tetrapropylammonium iodide.

The above-described acids or salts containing an anion species used to generate the anion species in a treatment liquid can be prepared by using industrially available salts or by using known methods. For example, a quaternary alkylammonium salt containing the anion species can be prepared by preparing a tetramethylammonium hydroxide aqueous solution and blowing in chlorine, bromine, or the like. A solution containing a quaternary alkylammonium salt of the anion species can also be prepared by a method in which a tetramethylammonium hydroxide solution is brought into contact with a cation-exchange type ion exchange resin, and the cations in the resin are converted to tetramethylammonium ions, and then the ions are exchanged by circulating a halogen acid such as hydrochloric, bromic, or iodic acid.

(Content of Anion Species)

In the treatment liquid of the present invention, the content of at least one kind of anion species among the above-described anion species is from 1 mass ppm to 20 mass %. When only one kind of the above-described anion species is contained in the treatment liquid of the present invention, the anion species needs to be contained in the treatment liquid in an amount of 1 mass ppm to 20 mass %. When two or more kinds of the above-described anion species are contained in the treatment liquid, at least one kind of the contained anion species needs to be contained in the treatment liquid in an amount of 1 mass ppm to 20 mass %. When the anion species is contained in the treatment liquid in the above-described range, the stability of alkylammonium bromide contained in the treatment liquid can be improved. The concentration of the anion species can be set to be sufficient to exchange counter ions with the bromide ion and stabilize alkylammonium bromide ion in the treatment liquid, and the concentration of the anion species is preferably from 1 mass ppm to 20 mass %, more preferably from 10 mass ppm to 10 mass %, and further preferably from 0.1 mass % to 10 mass % and most preferably from 1 mass % to 10 mass %.

When two or more kinds of the above-described anion species are contained in the treatment liquid, from the viewpoint of both sufficient etching rate and smoothness and stability of alkylammonium ion in the treatment liquid, the anion species contained in the concentration of from 1 mass ppm to 20 mass % are preferably halogen acid ion and halide ion. When two or more kinds of the above-described anion species are contained, the content of other anion species other than the anion species in the above-described concentration range is not particularly limited, and can be set appropriately according to the kind of metal species to be etched and the etching site, and the content of other anion species can also be from 1 mass ppm to 20 mass %. When the content of the above-described anion species is too high, the etching rate tends to decrease and the effect of improving stability tends to decrease, and therefore, the total content of the anion species when two or more kinds of anion species are contained is preferably 20 mass % or less, more preferably 10 mass % or less, and most preferably 5 mass % or less.

The content of anion species in the above-described treatment liquid can be measured using the ion chromatography method. Using this method, identification and quantification of anion species can be achieved by setting appropriate column types and conditions.

(Other Additives)

Other additives conventionally used for semiconductor treatment liquids can be added to the treatment liquid of the present invention if necessary without impairing the purpose of the present invention. For example, as other additives, acids, alkalis, metal corrosion inhibitors, water-soluble organic solvents, fluorine compounds, oxidizing agents, reducing agents, complexing agents, chelating agents, surfactants, defoaming agents, pH adjusters, and the like can be added.

(Method for Manufacturing Treatment Liquid)

The treatment liquid of the present invention containing hypohalite ions can be produced by adding and mixing alkylammonium salts to hypohalous acid solutions or hypohalite solutions containing hypohalite ions. A hypohalous acid solution can be produced by dissolving a commercially available hypohalite such as sodium hypochlorite, calcium hypochlorite, or sodium hypobromite in water, or by blowing chlorine or bromine gas into an alkaline solution such as sodium hydroxide solution or tetramethylammonium hydroxide solution. In addition, for example, by contacting a sodium hypochlorite solution or a sodium hypobromite solution with a tetramethylammonium-type ion exchange resin, the counter ion of the hypohalite ion can be exchanged to a tetramethylammonium ion.

The treatment liquid of the present invention containing periodate ions can be produced by adding and mixing alkylammonium salts to periodic acid solution or periodic acid salt aqueous solution containing periodate ions. A periodic acid salt aqueous solution can be produced by dissolving a commercially available periodic acid salt such as ortho-periodate, sodium ortho-periodate, potassium ortho-periodate, or sodium meta-periodate in water.

The following is a detailed description of the method of manufacturing a treatment liquid of the present invention, taking as an example a treatment liquid containing sodium hypochlorite aqueous solution in which the counter ion of hypochlorite ion is exchanged using an ion exchange resin. Specifically, the method is to produce a tetramethylammonium hypochlorite aqueous solution as the treatment liquid of the present invention by ion exchange of a sodium hypochlorite aqueous solution.

First, an aqueous solution containing tetramethylammonium ions, specifically, a tetramethylammonium hydroxide aqueous solution, is brought into contact with an ion exchange resin to prepare a tetramethylammonium-type ion exchange resin.

The ion exchange resin to be used can be any known cation exchange resin without any restrictions. For example, either a hydrogen-type ion exchange resin or a sodium-type ion exchange resin can be used. The hydrogen-type ion exchange resin, which is less likely to be contaminated with sodium, is particularly preferred. Also for the hydrogen-type ion exchange resin, weakly acidic and strongly acidic ion exchange resins can be used without any particular restrictions.

A tetramethylammonium hypochlorite aqueous solution can be produced by preparing the above-described tetramethylammonium-type ion exchange resin and then contacting the ion exchange resin with a hypochlorite aqueous solution, for example, a sodium hypochlorite aqueous solution.

A sodium hypochlorite aqueous solution can be prepared by dissolving sodium hypochlorite in water. Sodium hypochlorite is used here in terms of the favorable storage stability and handling, but any material that is commercially available and easy to obtain can be used, such as calcium hypochlorite. Furthermore, since the amount of sodium mixed in a treatment liquid after ion exchange can be further reduced, it is more preferable to use sodium hypochlorite, which contains less sodium chloride. Such sodium hypochlorite is generally commercially available as low-salt sodium hypochlorite.

An ion exchange process can be repeated. By repeating the ion exchange process, metal ions such as sodium and calcium, which are counter ions of hypochlorite ions contained in the tetramethylammonium hypochlorite aqueous solution, can be reduced.

By mixing and dissolving the obtained tetramethylammonium hypochlorite aqueous solution with an alkylammonium salt and other additives if necessary, the treatment liquid of the present invention containing tetramethylammonium ions can be produced.

The hypobromite ion contained in the treatment liquid of the present invention can be generated in the treatment liquid. Examples of methods for producing hypobromite ions in a treatment liquid include a method of oxidizing a bromine-containing compound with an oxidizing agent. The quantity ratio of the bromine-containing compound and the oxidizing agent in the treatment liquid is preferably determined by considering the stoichiometric ratio and reaction rate when the bromine-containing compound and the oxidizing agent react to produce hypobromite ion, and the stoichiometric ratio and reaction rate when the Br$^-$ contained in the treatment liquid and the oxidizing agent react to produce hypobromite ion, and actually, it is difficult to determine the appropriate quantity ratio of the bromine-containing compound and the oxidizing agent because of the complex influence of a plurality of factors on these reactions. However, when the ratio of a value of the concentration of the bromine-containing compound divided by the chemical equivalent (molar equivalent) of the bromine-containing compound to a value of the concentration of the oxidizing agent divided by the chemical equivalent (molar equivalent) of the oxidizing agent is in the range of from 0.001 to 100, the oxidizing agent can not only efficiently generate BrO$^-$ from the bromine-containing compound, but also oxidize Br$^-$ produced by a reduction reaction or a decomposition reaction of BrO$^-$ to BrO$^-$ again, thus stabilizing the etching rate of a transition metal.

For example, when the above-described bromine-containing compound is tetramethylammonium bromide and the above-described oxidizing agent is tetramethylammonium hypochlorite, the reaction equivalent (molar equivalent) of the bromine-containing compound and the chemical equivalent (molar equivalent) of the oxidizing agent are equal, and therefore, the ratio of the molar concentration of the bromine-containing compound to the concentration of the oxidizing agent can be in the range of from 0.001 to 100.

It is preferable to determine the quantity ratio of hypobromite ion and hypochlorite ion in the treatment liquid by considering the reduction rate of hypobromite ion, more precisely, by considering the rate at which Br$^-$ is produced by a reduction and/or decomposition reaction of hypobromite ion and the rate of oxidation reaction from Br$^-$ to BrO$^-$ by hypochlorite ion, but actually, it is difficult to determine the appropriate quantity ratio of hypobromite ion and hypochlorite ion because of the complex influence of a plurality of factors on these reactions. However, when the ratio of the molar concentration of hypobromite ion to the molar concentration of hypochlorite ion (molar concentration of hypobromite ion/molar concentration of hypochlorite ion) is in the range of from 0.001 to 100, the Br$^-$ produced by the reduction or decomposition reaction of BrO$^-$ can be oxidized to BrO$^-$ again by hypochlorite ion, thereby stabilizing the etching rate of a transition metal.

(Bromine-Containing Compound)

A bromine-containing compound used in the treatment liquid of the present invention can be any compound as long as the compound contains a bromine atom and is oxidized by an oxidizing agent described below to produce bromine, hypobromous acid, hypobromite ion, bromous acid, bromous acid ion, bromic acid, bromic acid ion, perbromic acid, perbromic acid ion, or bromide ion. For example, it is preferable to use at least one selected from the group consisting of bromine salt and hydrogen bromide. Hydrogen bromide here can be hydrogen bromide gas or hydrobromic acid, which is an aqueous solution of hydrogen bromide. Examples of the bromine salt include lithium bromide, sodium bromide, potassium bromide, rubidium bromide, cesium bromide, ammonium bromide, and onium bromide. Onium bromide herein refers to a compound formed from an onium ion and a bromide ion. An onium ion is a polyatomic cation compound formed by addition of an excess proton (hydrogen cation) to a monatomic anion. Specific examples thereof include cations such as imidazolium ion, pyrrolidinium ion, pyridinium ion, piperidinium ion, ammonium ion, phosphonium ion, fluoronium ion, chloronium ion, bromonium ion, iodonium ion, oxonium ion, sulfonium ion, selenonium ion, telluronium ion, arsonium ion, stibonium ion, and bismuthonium ion. A compound that generates hypobromous acid or hypobromite ions in the treatment liquid can also be suitably used as a bromine-containing compound. Examples of such a compound include, but are not limited to, bromohydantoins, bromoisocyanuric acids, bromosulfamic acids, and bromochoramines. More specific examples of such a compound include 1-bromo-3-chloro-5,5-dimethylhydantoin, 1,3-dibromo-5,5-dimethylhydantoin, and tribromoisocyanuric acid.

The above-described bromine-containing compound can be added to a treatment liquid as hydrogen bromide or a bromine salt, or as a solution containing a bromine salt, or as a bromine gas. Since handling in the semiconductor manufacturing process is easy, the bromine-containing compound is preferably mixed with another treatment liquid as a bromine salt or a solution containing a bromine salt or hydrogen bromide. One kind of bromine-containing compound contained in the treatment liquid can be used, or a combination of two or more kinds thereof can be used.

In semiconductor manufacturing, it is desirable that the bromine-containing compound does not contain metals because contamination of metals or metal ions causes a decrease in yield. Among bromine gas, hydrogen bromide, and bromine salts, onium bromide can be suitably used as the bromine-containing compound of the present invention due to substantial absence of metals. Among onium bromides, quaternary onium bromide, tertiary onium bromide, and hydrogen bromide are further suitable as the bromine-containing compounds of the present invention due to ease of industrial availability and handling.

Quaternary onium bromide is a bromine salt composed of ammonium ions or phosphonium ions that can exist stably in a treatment liquid. Examples of the quaternary onium bromide include tetramethylammonium bromide, ethyltrimethylammonium bromide, tetraethylammonium bromide, tetrapropylammonium bromide, tetrabutylammonium bromide, tetrapentylammonium bromide, tetrahexylammonium bromide, methyltriethylammonium bromide, diethyldimethylammonium bromide, trimethyl propylammonium bromide, butyltrimethylammonium bromide, trimethyl nonylammonium bromide, decyltrimethylammonium bromide, tetradecyl trimethylammonium bromide, hexadecykrimethylammonium bromide, hexadecyltrimethylammonium bromide, trimethylstearylammonium bromide, decamethonium bromide, phenyltrimethylammonium bromide, benzyltrimethylammonium bromide, dimethylpyrrolidinium bromide, dimethylpiperidinium bromide, 1-butyl-3-methylimidazolium bromide, and I-butyl-3-methylpyridinium bromide. A compound in which a proton is added to a tertiary amine, a secondary amine, or a primary amine can also be used. Examples of such a compound include methylamine hydrobromide, dinethylamine hydrobromide, ethylamine hydrobromide, diethylamine hydrobromide, triethylamine hydrobromide, 2-bromoethylamine hydrobromide, 2-bromoethyldimethylamine hydrobromide, ethylenediamine dibromide, propylamine hydrobromide, butylamine hydrobromide, tert-butylamine hydrobromide, neopentylamine hydrobromide, 3-bromo-1-propylamine hydrobromide, dodecylamine hydrobromide, cyclohexaneamine hydrobromide, and benzylamine hydrobromide. Examples of the quaternary phosphonium bromide include tetramethylphosphonium bromide, tetraethylphosphonium bromide, tetrapropylphosphonium bromide, tetrabutylphosphonium bromide, tetraphenylphosphonium bromide, methyltriphenylphosphonium bromide, phenyltrimethylphosphonium bromide, and methoxycarbonylmethyl(triphenyl)phosphonium bromide. Tertiary onium bromide is a bromine salt composed of sulfonium ions that can exist stably in a treatment liquid. Examples of the tertiary sulfonium bromide include trimethylsulfenium bromide, triethylsulfonium bromide, tripropylsulfonium bromide, tributyisulfonium bromide, triphenylsulfonium bromide, and (2carboxyethyl) dimethylsulfonium bromide. Among them, a quaternary onium bromide, which is a bromine salt composed of ammonium ions, is preferable due to high stability, industrial availability of high-purity products, and low cost.

The above-described quaternary onium bromide is preferably tetraalkylammonium bromide, which has particularly superior stability and can be easily synthesized.

In the tetraalkylammonium bromide, the carbon number of an alkyl group is not particularly limited, and the carbon number of the four alkyl groups can be the same or different. As such alkylammonium bromide, a tetraalkylammonium bromide in which the carbon number per alkyl group is from 1 to 20 can be suitably used. Among them, tetraalkylammonium bromide in which the carbon number of an alkyl group is small can be further suitably used because of the large number of bromine atoms per weight. Examples of such a compound include tetramethylammonium bromide, tetraethylammonium bromide, tetrapropylammonium bromide, tetrabutylammonium bromide, tetrapentylammonium bromide, and tetrahexylammonium bromide, and among them, tetramethylammonium bromide, tetraethylammonium bromide, tetrapropylammonium bromide, and tetrabutylammonium bromide are suitable, and tetramethylammonium bromide is the most suitable. There can be one or a plurality of bromine-containing compounds in a treatment liquid.

The tetraalkylammonium bromide used in the present invention can be commercially available tetraalkylammonium bromide or tetraalkylammonium bromide produced from tetraalkylammonium and bromide ions. Tetraalkylammonium bromide can be produced by mixing an aqueous solution containing tetraalkylammonium hydroxide with an aqueous solution containing bromide ions or a bromine-containing gas that generates bromide ions when dissolved in water.

Examples of tetraalkylammonium hydroxide used to produce tetraalkylammonium bromide include tetramethylammonium hydroxide, tetraethylammonium hydroxide, tetrapropylammonium hydroxide, and tetrabutylammonium hydroxide. Among them, tetramethylammonium hydroxide is more preferable due to high number of hydroxide ions per unit weight and easy availability of high-purity products.

Examples of bromine ion sources that generate bromide ions used to produce tetraalkylammonium bromide include hydrogen bromide, lithium bromide, sodium bromide, potassium bromide, rubidium bromide, cesium bromide, and ammonium bromide. Among these, hydrogen bromide is the most suitable due to substantial absence of metals, industrial availability, and easy availability of high-purity products. Examples of a bromine-containing gas that generates bromide ions when dissolved in water include hydrogen bromide gas.

The amount of the bromine-containing compound added to the treatment liquid is not particularly limited and can be determined in consideration of the etching rate of a transition metal, stability of the treatment liquid, solubility of the bromine-containing compound, the cost, and the like. The bromine-containing compound added to the treatment liquid is oxidized by an oxidizing agent as described below, and becomes a chemical species effective for etching transition metals, specifically, bromine, hypobromous acid (HBrO), hypobromite ion (BrO$^-$) bromous acid (HBrO$_2$), bromite ion (BrO$_2^-$), bromic acid (HBrO), bromateion (BrO$_3^-$), perbromic acid (HBrO$_4^-$), perbromate ion (BrO$_4^-$), or bromide ion (Br$^-$).

Among the chemical species that are effective for etching the above-described transition metals, since the etching rate of a transition metal is large in the treatment liquid containing HBrO, BrO$^-$, HBrO$_2$, BrO$_2^-$, HBrO$_3^-$, or BrO$_3^-$, the treatment liquid preferably contains these chemical species. Among them, a treatment liquid containing a large amount of HBrO and BrO$^-$ (hereinafter, referred to as BrO$^-$ or the like in some cases) is further preferable in that the treatment time can be shortened because the etching rate of a transition metal is particularly large.

Therefore, when the bromine-containing compound is oxidized by an oxidizing agent, it is preferable to oxidize the bromine atoms contained in the bromine-containing compound to HBrO, BrO⁻, HBrO$_2$, BrO$_2$⁻, HBrO$_3$, or BrO$_3$, and especially preferable to oxidize the bromine atoms to BrO⁻ or the like.

When the treatment liquid of the present invention contains a bromine-containing compound, an oxidizing agent, a base compound, and water, the treatment liquid can be a single component, or two or more treatment liquids or chemical liquids can be mixed together to form a treatment liquid. When the treatment liquid is a single component, the solution contains all of the bromine-containing compound, oxidizing agent, base compound, and alkylammonium salt represented by the above-described Formula (1). Two or more treatment liquids or chemical liquids can be mixed together to produce a treatment liquid. When the treatment liquid or the chemical liquid is two or more solutions, the treatment liquid or the chemical liquid contains at least one or more of bromine-containing compounds, oxidizing agents, base compounds, and water. In addition, other components as described below can be contained. The simultaneous presence of bromine-containing compounds, oxidising agents and the base compounds in the treatment liquid, whether the treatment liquid is produced by mixing one or more treatment liquids or chemical liquids, results in the oxidation of the bromine-containing compounds by the oxidising agents and the generation of chemical species that etch a transition metal.

When producing a treatment liquid by mixing two or more treatment liquids or chemical liquids, it is preferable to separate the chemical liquid containing a bromine-containing compound and an alkylammonium salt from the treatment liquid containing an oxidizing agent. By separating a bromine-containing compound and an alkylammonium salt from an oxidizing agent, oxidation of the bromine-containing compound and the alkylammonium salt by the oxidizing agent can be prevented, and the treatment liquid of the present invention can be stably stored.

For the mixing method of the chemical solution and the treatment liquid, widely known methods for mixing semiconductor liquids can be used. For example, a method using a mixing tank, a method of mixing in piping of semiconductor manufacturing equipment (in-line mixing), and a method of mixing by simultaneously applying a plurality of liquids on a wafer can be suitably used.

When a chemical liquid and a treatment liquid are mixed to produce a treatment liquid, the chemical liquid and the treatment liquid can be mixed at any time. When time is needed to oxidize a bromine-containing compound, by mixing a chemical liquid and a treatment liquid before etching a transition metal, time can be provided to generate a chemical species that etches the transition metal. In this case, when time is consumed to oxidize the bromine-containing compound, this may cause a bottleneck in the production line, resulting in a decrease in throughput. For this reason, the shorter the time required for oxidation, the better, and the duration is preferably one hour or less. The time needed for oxidation of the bromine-containing compound can be controlled by appropriately selecting the oxidizing agent concentration, bromine-containing compound concentration, pH of the treatment liquid, temperature of the treatment liquid, and agitation method of the treatment liquid. When the concentration of a chemical species that etches a transition metal is low, the lifetime of the treatment liquid may be short and the manufacturing process may be difficult to control. In such a case, it is preferable to perform mixing just before transition metal etching is carried out.

Therefore, when mixing a chemical liquid and a treatment liquid, it is preferable to mix a solution (treatment liquid) containing an oxidizing agent and a base compound with a chemical liquid containing a bromine-containing compound and an alkylammonium salt, and it is further preferable to mix a solution (treatment liquid) containing hypochlorite ions and a base compound with a chemical liquid containing a bromine-containing compound and an alkylammonium salt. The above-described solution (treatment liquid) containing hypochlorite ions and base compound is preferably alkaline.

When mixing the chemical liquid and the treatment liquid of the present invention, the pH of the treatment liquid after mixing is preferably alkaline. Specifically, the pH of the treatment liquid is preferably more than 7 and less than 14. When the chemical liquid or the treatment liquid before mixing is less than pH 7, the concentration of the base compound and/or water is adjusted in such a manner that the treatment liquid (containing bromine-containing compound, oxidizing agent, base compound, and water) after mixing is more than pH 7 and less than 14. By maintaining the pH of the treatment liquid after mixing at more than 7 and less than 14, the bromine-containing compound is quickly transformed by the oxidizing agent into a chemical species that etches a transition metal, and a transition metal film can be etched at a stable and sufficient rate.

When a chemical liquid and a treatment liquid are mixed to produce a chemical species that etches a transition metal, the pH of the chemical liquid and the treatment liquid to be mixed can be the same or different. When the pH of the chemical liquid and the pH of the treatment liquid are the same, the pH of the treatment liquid after mixing does not change considerably and can be suitably used as an etching liquid for the transition metal.

When a chemical liquid and a treatment liquid are mixed to produce a chemical species that etches a transition metal, the composition (bromine-containing compound concentration, oxidizing agent concentration, basic compound concentration, pH) after mixing can be within the above-described range, and the mixing method, such as the mixing ratio and the mixing order of the chemical liquid and the treatment liquid to be mixed, is not particularly limited. However, for example, when an alkaline solution containing a hypochlorite compound is mixed with an acidic solution containing a bromine-containing compound and an alkylammonium salt, decomposition of the hypochlorite compound may progress locally, and in this case, it is preferable to mix an acidic solution containing a bromine-containing compound and an alkylammonium salt into an alkaline solution containing a hypochlorite compound.

The chemical species that etch a transition metal, resulting from oxidation of a bromine-containing compound by an oxidizing agent, depend on the pH and oxidation-reduction potential (ORP) of the treatment liquid, but are mainly bromine or bromide ions, hypobromous acid, bromic acid, perbromic acid, and ions thereof.

(Oxidizing Agent)

The oxidizing agent used in the treatment liquid of the present invention has a function that can oxidize bromine-containing compounds and produce chemical species that are effective in etching a transition metal. Specific examples thereof include nitric acid, sulfuric acid, persulfuric acid, peroxodisulfuric acid, hypochlorous acid, chlorite, chloric acid, perchloric acid, hypobromous acid, bromic acid, bromate, perbromate, hypoiodic acid, hypoiodous acid, iodous acid, iodic acid, periodic acid, salts thereof, and ions produced by dissociation of these salts, as well as hydrogen peroxide, ozone, fluorine, chlorine, bromine, iodine, permanganate, chromate, dichromate, and cerium salt. These oxidizing agents can be used singly or in combination of a plurality of kinds thereof. When adding these oxidizing agents to the treatment liquid of the present invention, an appropriate solid, liquid, or gas can be selected depending on the properties of the oxidizing agent to be used.

Among the above-described oxidizing agents, due to the ability to exist stably even in alkaline conditions, hypochlorous acid, chlorous acid, chloric acid, perchlorous acid, hypobromous acid, bromous acid, perbromous acid, hypoiodous acid, iodous acid, iodic acid, periodic acid, and salts thereof, as well as ions, ozone, or hydrogen peroxide produced by dissociation of these salts is preferable, hypochlorous acid, chlorite, chloric acid, perchloric acid, hypobromous acid, bromous acid, perbromous acid, and salts thereof, as well as ions, ozone, or hydrogen peroxide produced by dissociation of these salts is more preferable, hypochlorite ion or ozone is further preferable, and hypochlorite ion is most preferable.

Use of hypochlorous acid, tetraalkylammonium hypochlorite, which is a salt of hypochlorous acid, or ozone as the oxidizing agent can substantially prevent contamination of metals, and is suitable as a treatment liquid for semiconductor manufacturing. Among them, tetraalkylammonium hypochlorite is particularly suitable due to stable existence in alkali and the ability to efficiently oxidize the above-described bromine-containing compounds.

The concentration of the oxidizing agent is not particularly limited, and can be added in an amount that can oxidize the bromine-containing compound to a chemical species that is effective in etching a transition metal.

The amount of the above-described oxidizing agent added is preferably 0.1 mass ppm or more and 10 mass % or less. When the amount of the oxidizing agent added is smaller than 0.1 mass ppm, the bromine-containing compound cannot be oxidized efficiently, and the etching rate of a transition metal decreases. In other words, in the composition where the oxidizing agent is not mixed, the etching rate is low. On the other hand, when the amount of the oxidizing agent added is greater than 10 mass %, the stability of the oxidizing agent decreases, which is not appropriate. When the transition metal is ruthenium, from the viewpoint of both suppressing generation of $RuO_4$ gas and the etching rate of ruthenium, it is more preferable that the concentration of the oxidizing agent is from 1 mass ppm or more and 5 mass % or less, and it is most preferable that the concentration is 0.5 mass % or more and 4 mass % or less.

Although the pH of the solution containing an oxidizing agent is not particularly limited, the pH is preferably more than 7 and less than 14, and more preferably 10 or more and 13 or less. A solution in this pH range can reduce the pH decrease that occurs when a solution containing the above-described bromine-containing compound and a solution containing the oxidizing agent are mixed, enabling stable production, storage, and use of the treatment liquid of the present invention. When the pH of a solution containing the oxidizing agent is less than 8, the pH- and the liquid volume of the solution containing the oxidizing agent can be adjusted in such a manner that the pH of the treatment liquid after mixing is alkaline when the solution containing the above-described bromine-containing compound and the solution containing the oxidizing agent are mixed.

(Manufacturing Method of Chemical Liquid)

The chemical liquid containing the above-described bromine-containing compound and alkylammonium salt can be produced by adding and mixing an alkylammonium salt to an aqueous solution containing tetramethylammonium bromide, ethyltrimethylammonium bromide, tetraethylammonium bromide, tetrapropylammonium bromide, or tetrabutylammonium bromide. An aqueous solution containing tetramethylammonium bromide, ethyltrimethylammonium bromide, tetraethylammonium bromide, tetrapropylammonium bromide, or tetrabutylammonium bromide can be produced by dissolving commercially available tetramethylammonium bromide, tetraethylammonium bromide, tetrapropylammonium bromide, or tetrabutylammonium bromide in water, or by adding an aqueous solution containing tetramethylammonium hydroxide, ethyltrimethylammonium hydroxide, tetraethylammonium hydroxide, tetrapropylammonium hydroxide, or tetrabutylammonium hydroxide to hydrobromic acid. Among the above, it is more preferable to produce tetramethylammonium bromide by adding tetramethylammonium hydroxide aqueous solution to hydrobromic acid, since high-purity products are easily available.

(Etching Method of Transition Metal)

The conditions under which the treatment liquid of the present invention is used can be determined according to the etching conditions of the etching equipment and the like to be used. For example, the treatment temperature can be in the range of from 10 to 80° C., and more preferably in the range of from 20 to 70° C.

The etching rate of a transition metal varies with temperature. Therefore, when improving the etching rate of a transition metal, a temperature range of from 40 to 70° C. can be selected among the above-described temperature ranges. With a temperature range of from 40 to 70° C. the etching rate can be increased, and a process can be carried out with ease of operation even with simple equipment.

The time for using the treatment liquid of the present invention is in the range of from 0.1 to 120 minutes, preferably from 0.5 to 60 minutes, and can be selected appropriately depending on the conditions of etching and the semiconductor device to be used. As a rinse liquid after using the treatment liquid of the present invention, an organic solvent such as alcohol can be used, but simply rinsing with deionized water is also sufficient. When an alkylammonium salt remains on the surface of a wafer after the above-described rinsing, it is preferable to clean the wafer with an acid such as hydrochloric acid, formic acid, acetic acid, sulfuric acid, nitric acid, hydrofluoric acid, citric acid, oxalic acid, or a mixture of ammonia water-hydrogen peroxide solution, hydrochloric acid-hydrogen peroxide solution, ozone water, sulfuric acid-hydrogen peroxide solution, or hydrofluoric acid-ammonium fluoride solution. A combination of these cleaning methods can be used. Alternatively, removal can be achieved by heating the wafer to a temperature at which the alkylammonium salt evaporates.

As described above, the treatment liquid of the present invention can increase the etching rate of a transition metal to 10 Å/min or more, preferably 30 Å/min or more, and has superior planarity of the surface of a transition metal after etching. The treatment liquid of the present invention can be suitably used when a transition metal, especially ruthenium, tungsten, molybdenum, or chromium, is used in a semiconductor device formation process.

EXAMPLES

The invention will be described in more detail by means of Examples below, but the invention is not limited to these Examples.

(pH Measurement Method)

30 mL of treatment liquids prepared in Examples and Comparative Examples were measured for pH using a tabletop pH meter (LAQUA F-73, manufactured by HORIBA, Ltd.). The pH measurement was carried out after a treatment liquid was prepared and stabilized at 25° C.

(Method of Calculating Hypohalite Ion Concentration and Periodate Ion Concentration)

The hypohalite ion concentration or the periodate ion concentration was measured using a UV-visible spectrophotometer (UV-2600, manufactured by Shimadzu Corporation). Calibration curves were prepared using a hypohalite ion solution or a periodate ion solution of known concentration to determine the concentration of hypohalite ions or periodate ions in the produced treatment liquids.

(Calculation Method of Tetramethylammonium Ion Concentration)

The tetramethylammonium ion concentrations in the treatment liquids of Examples and Comparative Examples were determined by calculation from the pH, the hypochlorite ion concentration, and the sodium ion concentration. The sodium ion concentration was measured by ICP-MS (Inductively Coupled Plasma Mass Spectrometer).

(Calculation Method of Etching Rate for Transition Metal)

An oxide film was formed on a silicon wafer using a batch-type thermal oxidation furnace, and a transition metal was deposited on the oxide film using a sputtering method. In the case where the transition metal was ruthenium, ruthenium was deposited at 1,200 Å (±10%). In the case where the transition metal was ruthenium dioxide, ruthenium dioxide was deposited at 1,000 Å (+10%). In the case where the transition metal was tungsten, 8,000 Å (±10%) of tungsten was deposited. In the case where the transition metal was molybdenum, 1,000 Å (±10%) of molybdenum was deposited. In the case where the transition metal was chromium. 1,000 Å (±10%) of chromium was deposited. The sheet resistance was measured with a four-probe resistance measuring instrument (Loresta-GP, manufactured by Mitsubishi Chemical Analytics Co., Ltd.) and converted to the film thickness. After an etching process, the sheet resistance was measured with a four-probe resistance measuring instrument in the same way and converted into the film thickness, which was used as the thickness of the transition metal film after the etching process. The difference between the film thickness of the transition metal after the etching process and the film thickness of the transition metal before the etching process was used as the amount of change in film thickness before and after the etching process.

30 mL of treatment liquids of Examples and Comparative Examples were prepared in a fluoroplastic container with a lid (manufactured by AsOne Corporation, PFA container 94.0 mL.), and each sample piece of 10×20 mm was immersed in the treatment liquid for 1 minute at 23° C., and the etching rate was calculated by dividing the amount of change in film thickness before and after treatment by the time of immersion.

The time to etch 50 Å±10 Å of the transition metal was calculated from the calculated etching rate, and the transition metal film was treated for a time to etch 50 Å±10 Å, and then, the surface of the transition metal was observed with a field emission scanning electron microscope (FE-SEM; Field Emission Scanning Electron Microscope) at a magnification of 100,000 times. When surface roughness was observed, it was classified as poor (C), when a little surface roughness was observed, it was classified as good (B), and when no surface roughness was observed, it was classified as excellent (A).

Example 1

(Production of Treatment Liquid)
<Pretreatment of Ion Exchange Resin: Preparation of Hydrogen-Type Ion Exchange Resin>

A glass column (manufactured by AsOne Corporation, BioColumn CF-50TK) with an inner diameter of about 45 mm was loaded with 200 mL of sodium-type strongly acidic ion exchange resin (manufactured by Organo Corporation, Amberlite IR-120BNa). Then, 1 L of 1 normal hydrochloric acid (manufactured by Wako Pure Chemical Industries, Ltd., for volumetric analysis) was passed through an ion-exchange resin column for exchange to the hydrogen-type, and 1 L of ultrapure water 1.0 was passed to rinse the ion-exchange resin.

<(a) Step>

Furthermore, 1 L of 10 mass % tetramethylammonium hydroxide solution was passed through the 209 ml, of ion exchange resin that had been exchanged to the hydrogen-type to exchange the ion from the hydrogen-type to the tetramethylammonium-type. After the ion exchange, 1 L of ultrapure water was passed to rinse the ion exchange resin.

<(b) Step>

69 g of sodium hypochlorite pentahydrate (manufactured by Wako Pure Chemical Industries, Ltd., special grade reagent) was placed in a 2 L-fluoropolymer container, and then 931 g of ultrapure water was added to prepare a 3.11 mass % sodium hypochlorite aqueous solution. The prepared sodium hypochlorite aqueous solution was passed through an ion exchange resin exchanged to tetramethylammonium-type, and 1,000 g of tetramethylammonium hypochlorite aqueous solution was obtained. To 999.9 g of the obtained tetramethylammonium hypochlorite aqueous solution, 100 mg of tetradecyltrimethylammonium bromide (manufactured by Tokyo Chemical Industry Co., Ltd., purity>98%) was added to obtain a treatment liquid with the composition described in Table 1.

<Evaluation>

Figure 3:
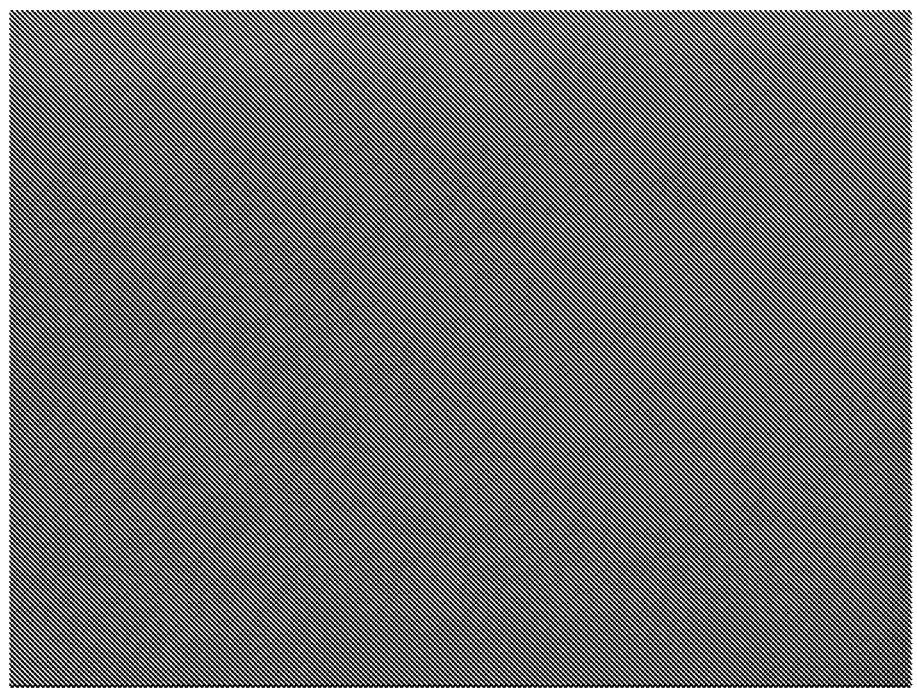
FIG. 3 is a photograph of the surface of ruthenium after etching treatment described in Example 1, observed with an electron microscope at a magnification of 100,000 times (substitute photograph for the drawing).

The pH, etching rate of ruthenium, and hypochlorite ion concentration of the treatment liquid immediately after production were evaluated. The evaluation of the etching rate of ruthenium was performed according to the above-described "Calculation Method of Etching Rate for Transition Metal". From the calculated etching rate, the time to etch 50 Å±10 Å of ruthenium was calculated, and the ruthenium film treated for the time to etch 50 Å±10 Å was prepared and used as a ruthenium film for surface observation. The surface of the ruthenium film for surface observation was observed with an electron microscope at a magnification of 100,000 times. The results of the observation are shown in FIG. 3.

Example 2

In Example 1, the amount of ion exchange resin in the (a) step was 564 mL, the passing volume of 10 mass % tetramethylammonium hydroxide solution was 2 L, and the concentration of sodium hypochlorite aqueous solution in the (b) step was 8.39 mass % to obtain a tetramethylammonium hypochlorite aqueous solution. Furthermore, as a pH adjustment step (c), a 25 mass % to tetramethylammonium hydroxide (TMAH) aqueous solution was added to the tetramethylammonium hypochlorite aqueous solution until the pH became 11. To 999 g of the obtained tetramethylammonium hypochlorite aqueous solution, 1 g of decyltrimethylammonium bromide (manufactured by Tokyo Chemical Industry Co., Ltd., purity>99%) was added to obtain a treatment liquid with the composition described in Table 1. The evaluation results are shown in Table 2.

Example 3

In Example 3, the treatment liquid was prepared in the same way as in Example 2 to achieve the composition shown in Table 1, except that dodecyltrimethylammonium bromide (manufactured by Tokyo Chemical Industry Co., Ltd., purity>98%) was used as the alkylammonium salt represented by Formula (1), and evaluation was performed using a ruthenium film (sample piece) prepared in the same manner as in Example 1.

Example 4

In Example 4, the treatment liquid was prepared in the same way as in Example 2 to achieve the composition shown in Table 1, except that octadecyltrimethylammonium bromide (manufactured by Tokyo Chemical Industry Co., Ltd., purity>98%) was used as the alkylammonium salt represented by Formula (1), and evaluation was performed using a ruthenium film (sample piece) prepared in the same manner as in Example 1.

Example 5

In Example 5, the treatment liquid was prepared in the same way as in Example 1 to achieve the composition shown in Table 1, except that n-octyltrimethylammonium bromide (manufactured by Tokyo Chemical Industry Co., Ltd., purity>98%) was used as the alkylammonium salt represented by Formula (1), and evaluation was performed using a ruthenium film (sample piece) prepared in the same manner as in Example 2.

Example 6

The same operation as in Example 1 was performed to obtain tetramethylammonium hypochlorite aqueous solution, and then, as a pH adjustment step (c), the tetramethylammonium hypochlorite aqueous solution was passed through a glass column packed with 50 mL of sodium-type strongly acidic ion exchange resin (manufactured by Organo Corporation, Amberlite IR-120BNa) exchanged for hydrogen-type. To 999.9 g of the obtained tetramethylammonium hypochlorite aqueous solution, 100 mg of tetradecyltrimethylammonium bromide was added, and a treatment liquid with the composition described in Table 1 was obtained. The evaluation results are shown in Table 2.

Example 7

In Example 7, the treatment liquid was prepared in the same way as in Example 2 to achieve the composition shown in Table 1, except that hexadecyltrimethylammonium bromide (manufactured by Tokyo Chemical Industry Co., Ltd., purity>98%) was used as the alkylammonium salt represented by Formula (1), and evaluation was performed using a ruthenium film (sample piece) prepared in the same manner as in Example 1.

Example 8

In Example 8, water and 25 mass % tetramethylammonium hydroxide were added to sodium hypochlorite pentahydrate (Wako Pure Chemical Industries, Ltd., special grade reagent) to achieve 2.15 mass % hypochlorite ion. 1 gram of tetradecyltrimethylammonium bromide was added to 999 g of the obtained sodium hypochlorite aqueous solution, and a treatment liquid with the composition described in Table 1 was obtained. The evaluation results are shown in Table 2.

Example 9

In Example 9, the treatment liquid was prepared in the same way as in Example 1 to achieve the composition shown in Table 1, except that didecyldimethylammonium bromide (manufactured by Tokyo Chemical Industry Co., Ltd., purity 98%) was used as the alkylammonium salt represented by Formula (1), and evaluation was performed using a ruthenium film (sample piece) prepared in the same manner as in Example 1.

Example 10

In Example 10, the treatment liquid was prepared in the same way as in Example 1 to achieve the composition shown in Table 1, except that didodecyldimethylammonium bromide (manufactured by Tokyo Chemical Industry Co., Ltd., purity>98%) was used as the alkylammonium salt represented by Formula (1), and evaluation was performed using a ruthenium film (sample piece) prepared in the same manner as in Example 1.

Example 11

Hexadecyltrimethylammonium bromate was precipitated by mixing hexadecyltrimethylammonium bromide aqueous solution and sodium bromate aqueous solution. The mixed liquid was filtered, and the precipitated hexadecyltrimethylammonium bromate was separated and washed three times with ultrapure water.

A treatment liquid with the composition described in Table 1 was obtained in the same manner as in Example 1, except that tetradecyltrimethylammonium bromide was changed to hexadecyltrimethylammonium bromate. Evaluation was performed using a ruthenium film (sample piece) prepared in the same manner as in Example 1.

Example 12

In Example 12, the treatment liquid was prepared in the same way as in Example 6 to achieve the composition shown in Table 1, except that decyltrimethylammonium bromide was used as the alkylammonium salt represented by Formula (1), and evaluation was performed using a ruthenium film (sample piece) prepared in the same manner as in Example 1.

Comparative Example 1

A treatment liquid was prepared in the same way as in Example 1, except that the alkylammonium salt represented by Formula (1) was not added, and the same evaluation as in Example 1 was performed.

Comparative Example 2

In Comparative Example 2, the treatment liquid was prepared in the same way as in Example 1 to achieve the composition shown in Table 1, except that tetrapropylammonium bromide (manufactured by Tokyo Chemical Industry Co., Ltd., purity>98%) was used as the alkylammonium salt represented by Formula (1), and evaluation was performed using a ruthenium film (sample piece) prepared in the same manner as in Example 1.

Example 13

A 25 mass % tetramethylammonium hydroxide aqueous solution, ultrapure water, and tetradecyltrimethylammonium bromide were added to ortho-periodic acid (manufactured by FUJIFILM Wako Pure Chemical Corporation, content>98.5%) to obtain treatment liquid with the composition described in Table 1. Evaluation was performed using a ruthenium film (sample piece) prepared in the same manner as in Example 1.

Example 14

In Example 14, the treatment liquid was prepared in the same way as in Example 6 to achieve the composition shown in Table 1, except that n-octyltrimethylammonium bromide was used as the alkylammonium salt represented by Formula (1). Using a wafer on which ruthenium oxide was deposited, the etching rate was evaluated using the above-described "Calculation Method of Etching Rate for Transition Metal". From the calculated etching rate, the time to etch 50 Å±10 Å of ruthenium oxide was calculated, and the ruthenium oxide film treated for the time to etch 50 Å±10 Å was prepared and used as a ruthenium oxide film for surface observation. The surface of the ruthenium oxide film for surface observation was observed with an electron microscope at a magnification of 100,000 times.

Comparative Example 3

In Comparative Example 3, a treatment liquid was prepared in the same manner as in Example 14, except that the alkylammonium salt represented by Formula (1) was not added, and the same evaluation as in Example 14 was performed.

Example 15

In Example 15, the treatment liquid was prepared in the same way as in Example 6 to achieve the composition shown in Table 1, except that decyltrimethylammonium bromide was used as the alkylammonium salt represented by Formula (1). Using a wafer on which tungsten was deposited, the etching rate was evaluated using the above-described "Calculation Method of Etching Rate for Transition Metal". From the calculated etching rate, the time to etch 50 Å±10 Å of tungsten was calculated, and the tungsten film treated for the time to etch 50 Å±10 Å was prepared and used as a tungsten film for surface observation. The surface of the tungsten film for surface observation was observed with an electron microscope at a magnification of 100.000 times.

Comparative Example 4

In Comparative Example 4, a treatment liquid was prepared in the same manner as in Example 15, except that the alkylammonium salt represented by Formula (1) was not added, and the same evaluation as in Example 15 was performed.

Example 16

In Example 16, the treatment liquid was prepared in the same way as in Example 2 to achieve the composition shown in Table 1, except that dodecyltrimethylammonium bromide was used as the alkylammonium salt represented by Formula (I). Using a wafer on which molybdenum was deposited, the etching rate was evaluated using the above-described "Calculation Method of Etching Rate for Transition Metal". From the calculated etching rate, the time to etch 50 Å±10 Å of molybdenum was calculated, and the molybdenum film treated for the time to etch 50 Å±10 Å was prepared and used as a molybdenum film for surface observation. The surface of the molybdenum film for surface observation was observed with an electron microscope at a magnification of 100,000 times.

Comparative Example 5

In Comparative Example 5, a treatment liquid was prepared in the same manner as in Example 16, except that the alkylammonium salt represented by Formula (1) was not added, and the same evaluation as in Example 16 was performed.

Example 17

In Example 17, the treatment liquid was prepared in the same way as in Example 1 to achieve the composition shown in Table 1, except that decyltrimethylammonium bromide was used as the alkylammonium salt represented by Formula (I). Using a wafer on which tungsten was deposited, the etching rate was evaluated using the above-described "Calculation Method of Etching Rate for Transition Metal". From the calculated etching rate, the time to etch 50 Å±10 Å of chromium was calculated, and the chromium film treated for the time to etch 50 Å±10 A was prepared and used as a chromium film for surface observation. The surface of the chromium film for surface observation was observed with an electron microscope at a magnification of 100,000 times.

Comparative Example 6

In Comparative Example 6, a treatment liquid was prepared in the same manner as in Example 17, except that the alkylammonium salt represented by Formula (1) was not added, and the same evaluation as in Example 17 was performed, in the above, the compositions of the treatment liquids prepared in Examples and Comparative Examples are shown in Table 1, and the results obtained are shown in Table 2.

TABLE 1

|  | Hypohalite ion or periodate ion (mass %) | Alkylammonium salt Type | Addition amount/ppm | pH |
|---|---|---|---|---|
| Example 1 | ClO-(3.5) | Tetradecyltrimethylammonium bromide | 100 | 10 |
| Example 2 | ClO-(5.8) | Decyltrimethylammonium bromide | 1000 | 11 |
| Example 3 | ClO-(7.3) | Dodecyltrimethylammonium bromide | 500 | 12 |
| Example 4 | ClO-(5.8) | Octadecyltrimethylammonium bromide | 500 | 11 |
| Example 5 | ClO-(7.9) | n-octyltrimethylammonium bromide | 10000 | 13 |
| Example 6 | ClO-(0.5) | Tetradecyltrimethylammonium bromide | 100 | 8 |
| Example 7 | ClO-(5.8) | Hexadecyltrimethylammonium bromide | 100 | 11 |
| Example 8 | ClO-(2.9) | Tetradecyltrimethylammonium bromide | 1000 | 11 |
| Example 9 | ClO-(2.9) | Didecyldimethylammonium bromide | 10 | 10 |
| Example 10 | ClO-(2.9) | Didodecyldimethylammonium bromide | 1 | 10 |
| Example 11 | ClO-(3.5) | Hexadecyltrimethylammonium bromate | 100 | 10 |
| Example 12 | ClO-(0.05) | Decyltrimethylammonium bromide | 1000 | 7.5 |
| Example 13 | H4IO6-(2.0) | Tetradecyltrimethylammonium bromide | 100 | 6 |
| Example 14 | ClO-(2.0) | n-octyltrimethylammonium bromide | 1000 | 10 |
| Example 15 | ClO-(2.0) | Decyltrimethylammonium bromide | 500 | 9 |
| Example 16 | ClO-(2.0) | Dodecyltrimethylammonium bromide | 100 | 11 |
| Example 17 | ClO-(2.0) | Decyltrimethylammonium bromide | 100 | 10 |
| Comparative Example 1 | ClO-(2.0) | " | " | 10 |
| Comparative Example 2 | ClO-(2.0) | Tetropropylammonium bromide | 1000 | 10 |
| Comparative Example 3 | ClO-(2.0) | " | " | 10 |
| Comparative Example 4 | ClO-(2.0) | " | " | 9 |
| Comparative Example 5 | ClO-(2.0) | " | " | 11 |
| Comparative Example 6 | ClO-(2.0) | " | " | 10 |

TABLE 21

|  | Group 6 metal etching (25° C./Å · min$^{-1}$) | Surface roughness (SEM) |
|---|---|---|
| Example 1 | Ru (55) | A |
| Example 2 | Ru (90) | A |
| Example 3 | Ru (45) | A |
| Example 4 | Ru (105) | B |
| Example 5 | Ru (30) | B |
| Example 6 | Ru (145) | A |
| Example 7 | Ru (115) | A |
| Example 8 | Ru (130) | A |
| Example 9 | Ru (80) | A |
| Example 10 | Ru (65) | A |
| Example 11 | Ru (57) | A |
| Example 12 | Ru (32) | A |
| Example 13 | Ru (96) | A |
| Example 14 | RuO$_2$ (27) | A |
| Example 15 | W (78) | A |
| Example 16 | Mo (62) | A |
| Example 17 | Cr (44) | A |
| Comparative Example 1 | Ru (155) | C |
| Comparative Example 2 | Ru (147) | C |
| Comparative Example 3 | RuO$_2$ (53) | C |
| Comparatwe Example 4 | W (194) | C |
| Comparative Example 5 | Mo (117) | C |
| Comparative Example 6 | Cr (94) | C |

Example 18

A tetramethylammonium hypochlorite aqueous solution with pH 12.0 and 0.1 mol/L was prepared in the same manner as in Example 2. A 25 mass % tetramethylammonium hydroxide aqueous solution and ultrapure water were added to tetramethylammonium bromide (manufactured by Tokyo Chemical Industry Co., Ltd., purity>97%) to prepare a tetramethylammonium bromide aqueous solution with pH 12.0 and 0.1 mol/L. To the obtained 998 g of tetramethylammonium bromide aqueous solution, 2 g of hexadecyltrimethylammonium bromide was added to prepare a chemical liquid containing a bromine-containing compound. 500 g of the above-described 0.1 mol/L, tetramethylammonium hypochlorite aqueous solution and 500 g of a chemical liquid containing a bromine-containing compound were mixed to obtain a treatment liquid with the composition described in Table 4. Evaluation was performed using a ruthenium film (sample piece) prepared in the same manner as in Example 1.

Example 19

A tetramethylammonium hypochlorite aqueous solution with pH 13.0 and 0.2 mol/L was prepared in the same manner as in Example 2. A tetramethylammonium bromide aqueous solution with pH 13.0 and 0.2 mol/l was prepared in the same manner as in Example 18. To the obtained 999.8 g of tetramethylammonium bromide aqueous solution, 200 mg of dimethyldioctylammonium bromide (manufactured by Tokyo Chemical Industry Co., Ltd., purity>97%) was added to prepare a chemical liquid containing a bromine-containing compound. 500 g of the above-described 0.2 mol/L tetramethylammonium hypochlorite aqueous solution and 500 g of a chemical liquid containing a bromine-containing compound were mixed to obtain a treatment liquid with the composition described in Table 4. Evaluation was performed using a ruthenium film (sample piece) prepared in the same manner as in Example 1.

Example 20

A tetramethylammonium hypochlorite aqueous solution with pH 12.0 and 0.1 mol/L was prepared in the same manner as in Example 2. A 25 mass % tetramethylammonium hydroxide aqueous solution and ultrapure water were added to tetrapropylammonium bromide (manufactured by Tokyo Chemical Industry Co., Ltd., purity>97%) to prepare a tetrapropylammonium bromide aqueous solution with pH 12.0 and 0.1 mol/L. To the obtained 999.8 g of tetrapropylammonium bromide aqueous solution, 200 mg of tetradecyltrimethylammonium bromide was added to prepare a chemical liquid containing a bromine-containing compound with the composition described in Table 3. 500 g of the above-described 0.1 mol/L tetramethylammonium hypochlorite aqueous solution and 500 g of a chemical liquid containing a bromine-containing compound with the composition described in Table 4 were mixed to obtain a treatment liquid with the composition described in Table 4. Evaluation was performed using a ruthenium film (sample piece) prepared in the same manner as in Example 1.

Example 21

A tetramethylammonium hypochlorite aqueous solution with pH 13.5 and 0.4 mol/L was prepared in the same manner as in Example 2. A tetramethylammonium bromide aqueous solution with pH 13.5 and 0.4 mol/L was prepared in the same manner as in Example 18. To the obtained 999.998 g of tetramethylammonium bromide aqueous solution, 2 mg of tetrapentylammonium bromide (manufactured by Tokyo Chemical Industry Co., Ltd., purity>98%) was added to prepare a chemical liquid containing a bromine-containing compound with the composition described in Table 3. 500 g of the above-described 0.4 mol/L tetramethylammonium hypochlorite aqueous solution and 500 g of a chemical liquid containing a bromine-containing compound were mixed to obtain a treatment liquid with the composition described in Table 4. Evaluation was performed using a ruthenium film (sample piece) prepared in the same manner as in Example 1.

Example 22

A tetramethylammonium hypochlorite aqueous solution with pH 11.0 and 0.002 mol/L was prepared in the same manner as in Example 2. A tetramethylammonium bromide aqueous solution with pH 11.0 and 0.002 mol/L was prepared in the same manner as in Example 18. To the obtained 999.8 g of tetramethylammonium bromide aqueous solution, 200 mg of hexyldimethyloctyl bromide (manufactured by Tokyo Chemical Industry Co., Ltd., purity>97%) was added to prepare a chemical liquid containing a bromine-containing compound with the composition described in Table 3. 500 g of the above-described 0.002 mol/L tetramethylammonium hypochlorite aqueous solution and 500 g of a chemical liquid containing a bromine-containing compound were mixed to obtain a treatment liquid with the composition described in Table 4. Evaluation was performed using a ruthenium film (sample piece) prepared in the same manner as in Example 1.

Example 23

A tetramethylammonium hypochlorite aqueous solution with pH 12.0 and 0.19 mol/L was prepared in the same manner as in Example 2. A tetramethylammonium bromide aqueous solution with pH 12.0 and 0.1 mol/L, was prepared in the same manner as in Example 18. To the obtained 998 g of tetramethylammonium bromide aqueous solution, 2 g of dodecyltrimethylammonium bromide was added to prepare a chemical liquid containing a bromine-containing compound with the composition described in Table 3. 500 g of the above-described 0.19 mol/L tetramethylammonium hypochlorite aqueous solution and 500 g of a chemical liquid containing a bromine-containing compound were mixed to obtain a treatment liquid with the composition described in Table 4. Evaluation was performed using a ruthenium film (sample piece) prepared in the same manner as in Example 1.

Example 24

In Example 24, a tetramethylammonium hypochlorite aqueous solution with pH 12.0 and 0.1 mol/L was prepared in the same manner as in Example 2. A chemical liquid containing a bromine-containing compound was prepared by mixing n-octyltrimethylammonium bromide with an aqueous solution obtained by mixing ethyltrimethylammonium hydroxide aqueous solution with hydrobromic acid aqueous solution to achieve the composition described in Table 3. 500 g of the above-described 0.1 mol/L tetramethylammonium hypochlorite aqueous solution and 500 g of the chemical liquid containing the bromine-containing compound were mixed to obtain a treatment liquid with the composition described in Table 4. Evaluation was performed using a ruthenium film (sample piece) prepared in the same manner as in Example 1.

Example 25

In Example 25, a tetramethylammonium hypochlorite aqueous solution with pH 11.0 and 0.1 mol/L was prepared in the same manner as in Example 2. A tetramethylammonium bromide aqueous solution with pH 11.0 and 0.1 mol/L was prepared in the same manner as in Example 18. To the obtained 999.98 g of tetramethylammonium bromide aqueous solution, 20 mg of hexadecyltrimethylammonium bromide was added to prepare a chemical liquid containing a bromine-containing compound with the composition described in Table 3. 500 g of the above-described 0.1 mol/L tetramethylammonium hypochlorite aqueous solution and 500 g of a chemical liquid containing a bromine-containing compound with the composition described in Table 3 were mixed to obtain a treatment liquid with the composition described in Table 4. Evaluation was performed using ruthenium oxide films (sample pieces) prepared in the same manner as in Example 14.

Example 26

In Example 26, the treatment liquid was prepared in the same manner as in Example 18 to have the composition shown in Table 3, except that tetradecyltrimethylammonium bromide was used as the alkylammonium salt represented by Formula (1). Evaluation was performed using tungsten films (sample pieces) prepared in the same manner as in Example 14.

Example 27

In Example 27, the treatment liquid was prepared in the same manner as in Example 18 to have the composition shown in Tables 3 and 4, except that dodecyltrimethylammonium bromide was used as the alkylammonium salt represented by Formula (1). Evaluation was performed using molybdenum films (sample pieces) prepared in the same manner as in Example 15.

Example 28

In Example 28, the treatment liquid was prepared in the same manner as in Example 18 to have the composition shown in Tables 3 and 4, except that decyltrimethylammonium bromide was used as the alkylammonium salt represented by Formula (1). Evaluation was performed using chromium films (sample pieces) prepared in the same manner as in Example 16.

Comparative Examples 7 to 11

In Comparative Examples 7 to 11, the treatment liquids were prepared in the same manner as in Example 18, except that the alkylammonium salt represented by Formula (1) was not added. In Comparative Example 7, evaluation was performed using a ruthenium film (sample piece) prepared in the same manner as in Example 1. In Comparative Example 8, evaluation was performed using a ruthenium dioxide film (sample piece) prepared in the same manner as in Example 14. In Comparative Example 9, evaluation was performed using a tungsten film (sample piece) prepared in the same manner as in Example 15. In Comparative Example 10, evaluation was performed using a molybdenum film (sample piece) prepared in the same manner as 1.0 in Example 16. In Comparative Example 11, evaluation was performed using a chromium film (sample piece) prepared in the same manner as in Example 17.

As described above, the compositions of the treatment liquids prepared in Examples and Comparative Examples are shown in Table 3 and Table 4, and the results obtained are shown in Table 4.

TABLE 3

|  | Treatment liquid containing oxidizing agent | | Chemical liquid containing bromine-containing compound | | | | |
|---|---|---|---|---|---|---|---|
|  | | | Bromine-containing compound (mass %) | Alkylammonium salt | | | |
|  | TMACIO (mass %) | pH | | Type | Addition amount/ppm | pH | |
| Example 18 | 1.26 | 12 | TMABr (1.51) | Hexedacyltrimethylammonium bromide | 2000 | 12 | |
| Example 19 | 2.51 | 13 | TMABr (3.03) | Dimethyldioctylammonium bromide | 200 | 13 | |
| Example 20 | 1.26 | 12 | TPABr (1.86) | Tetradecyltrimethylammonium bromide | 200 | 12 | |
| Example 21 | 5.02 | 13.5 | TMABr (6.05) | Tetraheptylammonium bromide | 2 | 13.5 | |
| Example 22 | 0.025 | 11 | TMABr (0.03) | Hexyldimethyloctyl ammonium bromide | 200 | 11 | |
| Example 23 | 2.39 | 12 | TMABr (1.51) | Dodecyltrimethylammonium bromide | 2000 | 12 | |
| Example 24 | 1.26 | 12 | ETMABr (1.68) | n-octyltrimethylammonium bromide | 2000 | 12 | |
| Example 25 | 1.26 | 12 | TMABr (1.51) | Hexadecyltrimethylammonium bromide | 20 | 12 | |
| Example 26 | 1.26 | 12 | TMABr (1.51) | Tetradecyltrimethylammonium bromide | 200 | 12 | |
| Example 27 | 1.26 | 12 | TMABr (1.51) | Dodecyltrimethylammonium bromide | 200 | 12 | |
| Example 28 | 1.26 | 12 | TMABr (1.51) | Decyltrimethylammonium bromide | 200 | 12 | |
| Comparative Example 7 | 1.26 | 12 | TMABr (1.51) | — | — | 12 | |
| Comparative Example 8 | 1.26 | 12 | TMABr (1.51) | — | — | 12 | |
| Comparative Example 9 | 1.26 | 12 | TMABr (1.51) | — | — | 12 | |
| Comparative Example 10 | 1.26 | 12 | TMABr (1.51) | — | — | 12 | |
| Comparative Example 11 | 1.26 | 12 | TMABr (1.51) | — | — | 12 | |

TABLE 4

| | hypochlorite ion (mass %) | Alkylammonium salt Type | Addition amount/ ppm | pH | Group 6 metal etching (25° C./Å · min$^{-1}$) | Surface roughness (SEM) |
|---|---|---|---|---|---|---|
| Example 18 | BrO- (0.48) | Hexadecyltrimethylammonium bromide | 1000 | 12 | Ru (78) | A |
| Example 19 | BrO- (0.96) | Dimethyldioctylammonium bromide | 100 | 13 | Ru (123) | A |
| Example 20 | BrO- (0.48) | Tetradecyltrimethylammonium bromide | 100 | 12 | Ru (88) | A |
| Example 21 | BrO- (1.92) | Tetraheptylammonium bromide | 1 | 13.5 | Ru (58) | B |
| Example 22 | BrO- (0.0096) | Hexyldimethyloctylammonium bromide | 100 | 11 | Ru (34) | A |
| Example 23 | ClO-(0.74) BrO-(0.48) | Dodecyltrimethylammonium bromide | 1000 | 12 | Ru (92) | A |
| Example 24 | BrO- (0.48) | n-octyltrimethylammonium bromide | 1000 | 12 | Ru (64) | A |
| Example 25 | BrO- (0.48) | Hexadecyltrimethylammonium bromide | 10 | 11 | RuO2 (52) | A |
| Example 26 | BrO- (0.48) | Tetradecyltrimethylammonium bromide | 100 | 12 | W (95) | A |
| Example 27 | BrO- (0.48) | Dodecyltrimethylammonium bromide | 100 | 12 | Mo (82) | A |
| Example 28 | BrO- (0.48) | Decyltrimethylammonium bromide | 100 | 12 | Cr (78) | A |
| Comparative Example 7 | BrO- (0.48) | — | — | 12 | Ru (130) | C |
| Comparative Example 8 | BrO- (0.48) | — | — | 12 | RuO2 (87) | C |
| Comparative Example 9 | BrO- (0.48) | — | — | 12 | W (216) | C |
| Comparative Example 10 | BrO- (0.48) | — | — | 12 | Mo (148) | C |
| Comparative Example 11 | BrO- (0.48) | — | — | 12 | Cr (114) | C |

(Preparation of Tetramethylammonium Chlorate (($CH_3$)$_4NClO_3$))

A saturated solution obtained by adding sodium chlorate (manufactured by FUJIFILM Wako Pure Chemical Corporation) to ion exchange water was stored in a refrigerator for 24 hours, and the precipitated sodium chlorate was collected by filtration. The collected sodium chlorate was diluted with ultrapure water and analyzed using an ion chromatography analyzer. By analyzing $CO_3^-$, $SO_4^-$, and $Cl^-$ in the diluted solution, it was confirmed that $Na_2CO_3$, $Na_2SO_4$, and NaCl contained as impurities had been reduced. By repeating the above-described purification step, it was confirmed that the $CO_3^-$, $SO_4^-$, and $Cl^-$ were less than 500 ppb each, and the purified sodium chlorate was obtained.

Next, 200 mL of strongly acidic ion exchange resin (manufactured by Organo Corporation, Amberlite IR-120BNa) was loaded into a glass column (manufactured by AsOne Corporation, BioColumn CF-50TK) with an inner diameter of approximately 45 mm. Then, 1 L of 1 normal hydrochloric acid (manufactured by FUJIFILM Wako Pure Chemical Corporation, for volumetric analysis) was passed through an ion exchange resin column to exchange to the hydrogen-type, and 1 L of ultrapure water was passed to rinse the ion exchange resin. Furthermore, 2 L of 2.38% tetramethylammonium hydroxide solution was passed through the ion exchange resin, which had been exchanged to the hydrogen-type, to exchange the ion from the hydrogen-type to the tetramethylammonium-type. After the ion exchange, 1 L of ultrapure water was passed to rinse the ion exchange resin.

After 6.4 g of purified sodium chlorate was placed in a fluoropolymer container, 93.6 g of ultrapure water was added to prepare a 6.4 mass % sodium chlorate solution. The prepared sodium chlorate aqueous solution was passed through an ion exchange resin that had been exchanged to the tetramethylammonium-type. The collected tetramethylammonium chlorate was analyzed for Na concentration using radio frequency inductively coupled plasma optical emission spectrometry (iCAP 6500DuO, manufactured by Thermo SCIENTIFIC Inc.) to confirm that the ion exchange was sufficient. When the ion exchange was insufficient, the above-described operation was repeated to obtain a 10 mass % tetramethylammonium chlorate solution with a Na concentration of 500 ppb or less. The obtained solution was heat treated to obtain tetramethylammonium chlorate powder.

To the treatment liquid prepared using the same method as in Example 4, tetramethylammonium chlorate was added to achieve the composition in Table 5.

<Evaluation of Stability>

The obtained treatment liquid was stored in a 30-mL fluoropolymer container and kept in a dark place at 25° C. for 30 days. The presence or absence of precipitation of alkylammonium salts was visually checked. When there was precipitation, it was classified as C. When there was no precipitation, the product was stored in a dark place for another 15 days and the presence or absence of precipitation was visually checked. The case with no precipitation was classified as A, and the case with precipitation was classified as B.

Example 30

To the treatment liquid prepared using the same method as in Example 18, tetramethylammonium chloride (manufactured by Tokyo Chemical Industry Co., Ltd., purity>98%) was added to achieve the composition shown in Table 5. The stability of the treatment liquid obtained was evaluated using the same method as in Example 29.

Example 31

To the treatment liquid prepared using the same method as in Example 18, tetramethylammonium chloride was added to achieve the composition shown in Table 5. The stability of the treatment liquid obtained was evaluated using the same method as in Example 29.

As described above, the compositions of the treatment liquids prepared in Examples and the results obtained are shown in Table 5.

concentration of alkylammonium salts in the chemical liquid after 15 days of storage was measured, and when the ratio of the concentration of alkylammonium salts after 15 days of storage to the concentration of alkylammonium salts before storage was 0.5 or more, it was classified as A, and when the ratio was less than 0.5, it was classified as B. The concentration of alkylammonium salts was measured using a liquid chromatograph mass spectrometer (Xevo QT of MS, manufactured by Waters Corporation).

Example 33

SD-25 (ultrapure tetramethylammonium hydroxide aqueous solution, manufactured by Tokuyama Corporation),

TABLE 5

| | Hypochrolite ion (mass %) | Alkylammonium salt Type | Addition amount/ ppm | Chlorate ion or chloride ion (mass %) | pH | Stability |
|---|---|---|---|---|---|---|
| Example 29 | ClO- (5.8) | Octadecyltrimethyammonium bromide | 500 | ClO3- (1) | 11 | A |
| Example 30 | BrO- (0.48) | Hexadecyltrimethylammonium bromide | 1000 | Cl- (5) | 12 | A |
| Example 31 | BrO- (0.48) | Hexadecyltrimethylammonium bromide | 1000 | Cl- (0.1) | 12 | B |
| Example 4 | ClO- (5.8) | Octadecyltrimethylammonium bromide | 500 | — | 11 | C |
| Example 18 | BrO- (0.48) | Hexadecyltrimethylammonium bromide | 1000 | — | 12 | C |

Example 32

A tetramethylammonium bromide aqueous solution with pi 12.0 and 0.1 mol/L was prepared by mixing 47% hydrobromic acid (ultra-pure hydrobromic acid, manufactured by Tama Chemicals Co., Ltd.) with SD-25 (ultra-pure tetramethylammonium hydroxide aqueous solution, manufactured by Tokuyama Corporation) and ultrapure water. To 999 g of the obtained tetramethylammonium bromide aqueous solution, 1 g of decyltrimethylammonium bromide was added to obtain a chemical liquid with the composition described in Table 6.

The chemical liquid was passed and filtered using a filtration filter (manufactured by Entegris Japan Co., Ltd., polytetrafluoroethylene, pore size 20 nm) until the concentration of metal impurities in the obtained chemical liquid was less than 1 ppb.

(Measurement Method of Metal Impurity Concentration in Chemical Liquid)

To a 25 ml polyfluoroalkyl ether (PFA) volumetric flask (manufactured by AsOne Corporation, PFA volumetric flask), ultrapure water and 1.25 ml of high-purity nitric acid (manufactured by KANTO CHEMICAL CO., INC., Ultrapure-100 nitric acid) were added. Then, using a pipette (manufactured by AsOne, Pipetman P1000) and a fluoroplastic pipette tip (manufactured by AsOne, fluoroplastic pipette tip), 0.25 ml of the chemical solution was collected and added to the PFA volumetric flask and stirred. Then, the measurement sample was prepared by scale-up with ultrapure water and diluted 100 times. A high-resolution inductively coupled plasma mass spectrometer (manufactured by ThermoFisher Scientific Inc., Element2) was then used to quantify the metal atoms using the calibration curve method.

(Stability Evaluation of Alkylammonium Bromide)

The obtained chemical liquid was stored in a 30-mL fluoropolymer container and kept at 80° C. for 15 days. The sodium nitrate (manufactured by FUJIFILM Wako Pure Chemical Corporation, 99.9% purity), potassium nitrate (manufactured by FUJIFILM Wako Pure Chemical Corporation, 99.9% purity) and ultrapure water were mixed with 47% hydrobromic acid (ultrapure hydrobromic acid, manufactured by Tama Chemicals Co., Ltd.) to achieve the composition shown in Table 6. The stability of the treatment liquid obtained in the same manner as in Example 32 was evaluated.

Example 34

SD-25 (ultrapure tetramethylammonium hydroxide aqueous solution, manufactured by Tokuyama Corporation), magnesium nitrate hexahydrate (manufactured by FUJIFILM Wako Pure Chemical Corporation, 99.999% purity), calcium nitrate tetrahydrate (manufactured by FUJIFILM Wako Pure Chemical Corporation, 99.98% purity) and ultrapure water were mixed with 47% hydrobromic acid (ultrapure hydrobromic acid, manufactured by Tama Chemicals Co., Ltd.) to achieve the composition shown in Table 6. The stability of the treatment liquid obtained in the same manner as in Example 32 was evaluated.

Example 35

SD-25 (ultrapure tetramethylammonium hydroxide aqueous solution, manufactured by Tokuyama Corporation), aluminum nitrate nonahydrate (manufactured by FUJIFILM Wako Pure Chemical Corporation, 99.999% purity), and ultrapure water were mixed with 47% hydrobromic acid (ultrapure hydrobromic acid, manufactured by Tama Chemicals Co., Ltd.) to achieve the composition shown in Table 6. The stability of the treatment liquid obtained in the same manner as in Example 32 was evaluated.

Example 36

SD-25 (ultrapure tetramethylammonium hydroxide aqueous solution, manufactured by Tokuyama Corporation), iron nitrate nonahydrate (manufactured by FUJIFILM Wako Pure Chemical Corporation, 99.999% purity), and ultrapure water were mixed with 47% hydrobromic acid (ultrapure hydrobromic acid, manufactured by Tama Chemicals Co., Ltd.) to achieve the composition shown in Table 6. The stability of the treatment liquid obtained in the same manner as in Example 32 was evaluated.

Example 37

SD-25 (ultrapure tetramethylammonium hydroxide aqueous solution, manufactured by Tokuyama Corporation), nickel nitrate hexahydrate (manufactured by FUJIFILM Wako Pure Chemical Corporation, 99.9985% purity), cobalt nitrate hexahydrate (manufactured by FUJIFILM Wako Pure Chemical Corporation, 99.999% purity) and ultrapure water were mixed with 47% hydrobromic acid (ultrapure hydrobromic acid, manufactured by Tama Chemicals Co., Ltd.) to achieve the composition shown in Table 6. The stability of the treatment liquid obtained in the same manner as in Example 32 was evaluated.

Example 38

SD-25 (ultrapure tetramethylammonium hydroxide aqueous solution, manufactured by Tokuyama Corporation), copper(II) nitrate trihydrate (manufactured by FUJIFILM Wako Pure Chemical Corporation, 99.999% purity), and ultrapure water were mixed with 47% hydrobromic acid (ultrapure hydrobromic acid, manufactured by Tama Chemicals Co., Ltd.) to achieve the composition shown in Table 6. The stability of the treatment liquid obtained in the same manner as in Example 32 was evaluated.

Example 39

SD-25 (ultrapure tetramethylammonium hydroxide aqueous solution, manufactured by Tokuyama Corporation), silver nitrate (manufactured by FUJIFILM Wako Pure Chemical Corporation, 99.9995% purity), and ultrapure water were mixed with 47% hydrobromic acid (ultrapure hydrobromic acid, manufactured by Tama Chemicals Co., Ltd.) to achieve the composition shown in Table 6. The stability of the treatment liquid obtained in the same manner as in Example 32 was evaluated.

Example 40

SD-25 (ultrapure tetramethylammonium hydroxide aqueous solution, manufactured by Tokuyama Corporation), cadmium nitrate tetrahydrate (manufactured by FUJIFILM Wako Pure Chemical Corporation, 99.9% purity), and ultrapure water were mixed with 47% hydrobromic acid (ultrapure hydrobromic acid, manufactured by Tama Chemicals Co., Ltd.) to achieve the composition shown in Table 6. The stability of the treatment liquid obtained in the same manner as in Example 32 was evaluated.

Example 41

SD-25 (ultrapure tetramethylammonium hydroxide aqueous solution, manufactured by Tokuyama Corporation), barium nitrate (manufactured by FUJIFILM Wako Pure Chemical Corporation, 99.999% purity), and ultrapure water were mixed with 47% hydrobromic acid (ultrapure hydrobromic acid, manufactured by Tama Chemicals Co., Ltd.) to achieve the composition shown in Table 6. The stability of the treatment liquid obtained in the same manner as in Example 32 was evaluated.

Example 42

SD-25 (ultrapure tetramethylammonium hydroxide aqueous solution, manufactured by Tokuyama Corporation), lead nitrate (manufactured by FUJIFILM Wako Pure Chemical Corporation, 99.999% purity), and ultrapure water were mixed with 47% hydrobromic acid (ultrapure hydrobromic acid, manufactured by Tama Chemicals Co., Ltd.) to achieve the composition shown in Table 6. The stability of the treatment liquid obtained in the same manner as in Example 32 was evaluated.

TABLE 6

| | Bromide ion (mass %) | Alkylammonium salt Type | Addition amount/ ppm | pH | Na | K | Mg | Ca | Al | Fe | Ni | Co | Cu | Ag | Cd | Ba | Pb | Stability of alkyl-ammonium |
|---|---|---|---|---|---|---|---|---|---|---|---|---|---|---|---|---|---|---|
| Example 32 | 0.44 | Decyltrimethylammonium bromide | 1000 | 12 | <1 | <1 | <1 | <1 | <1 | <1 | <1 | <1 | <1 | <1 | <1 | <1 | <1 | A |
| Example 33 | 0.44 | Decyltrimethylammonium bromide | 1000 | 12 | 100 | 100 | <1 | <1 | <1 | <1 | <1 | <1 | <1 | <1 | <1 | <1 | <1 | B |
| Example 34 | 0.44 | Decyltrimethylammonium bromide | 1000 | 12 | <1 | <1 | 100 | 100 | <1 | <1 | <1 | <1 | <1 | <1 | <1 | <1 | <1 | B |
| Example 35 | 0.44 | Decyltrimethylammonium bromide | 1000 | 12 | <1 | <1 | <1 | <1 | 100 | <1 | <1 | <1 | <1 | <1 | <1 | <1 | <1 | B |
| Example 36 | 0.44 | Decyltrimethylammonium bromide | 1000 | 12 | <1 | <1 | <1 | <1 | <1 | 100 | <1 | <1 | <1 | <1 | <1 | <1 | <1 | B |
| Example 37 | 0.44 | Decyltrimethylammonium bromide | 1000 | 12 | <1 | <1 | <1 | <1 | <1 | <1 | 100 | 100 | <1 | <1 | <1 | <1 | <1 | B |
| Example 38 | 0.44 | Decyltrimethylammonium bromide | 1000 | 12 | <1 | <1 | <1 | <1 | <1 | <1 | <1 | <1 | 100 | <1 | <1 | <1 | <1 | B |
| Example 39 | 0.44 | Decyltrimethylammonium bromide | 1000 | 12 | <1 | <1 | <1 | <1 | <1 | <1 | <1 | <1 | <1 | 100 | <1 | <1 | <1 | B |
| Example 40 | 0.44 | Decyltrimethylammonium bromide | 1000 | 12 | <1 | <1 | <1 | <1 | <1 | <1 | <1 | <1 | <1 | <1 | 100 | <1 | <1 | B |
| Example 41 | 0.44 | Decyltrimethylammonium bromide | 1000 | 12 | <1 | <1 | <1 | <1 | <1 | <1 | <1 | <1 | <1 | <1 | <1 | 100 | <1 | B |
| Example 42 | 0.44 | Decyltrimethylammonium bromide | 1000 | 12 | <1 | <1 | <1 | <1 | <1 | <1 | <1 | <1 | <1 | <1 | <1 | <1 | 100 | B |

As shown in Table 2 and Table 4, Examples 1 to 28, in which the treatment liquids of the present invention were applied, maintained the flatness of the surface of the transition metal after the etching treatment. Examples 1 to 28 clearly indicated that the etching rate of transition metals can be controlled to a desired value by adjusting the oxidizing agent concentration, the pH, and the type and/or concentration of alkylammonium salt. As described above, the treatment liquid of the present invention can be suitably used as a treatment liquid for semiconductor manufacturing.

In Comparative Examples 1, 3 to 11, no alkylammonium salt was added, and therefore surface roughness was observed after etching and flatness was reduced compared to Examples 1 to 28. In Comparative Example 2, in which alkylammonium salt was added, surface roughness was observed after etching and flatness was degraded compared to Examples due to an effect of a small carbon number of an alkyl group.

As shown in Table 5, precipitation of alkylammonium bromide can be suppressed by adding chloride ions or chlorate ions to the treatment liquid of the present invention.

As shown in Table 6, the stability of alkylammonium bromide can be improved by reducing the amount of metal impurities in the chemical liquid to 1 ppb or less.

DESCRIPTION OF SYMBOLS

1 Substrate
2 Interlayer insulating film
3 Ruthenium

The invention claimed is:

1. A treatment liquid for etching a transition metal on a semiconductor wafer, the treatment liquid comprising:
(A) a hypohalite ion; and
(B) an alkylammonium salt represented by the following Formula (1)
wherein the hypohalite ion is a hypobromite ion, and the concentration of hypobromite ions is from 0.0096 to 1.92 mass %,

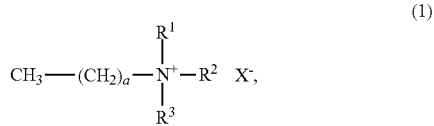

wherein a is an integer from 6 to 20, $R^1$, $R^2$, and $R^3$ are independently a hydrogen atom or an alkyl group having carbon number from 1 to 20, and $X^-$ is a bromine-containing ion.

2. The treatment liquid for etching a transition metal on a semiconductor wafer according to claim 1, wherein the concentration of the (B) alkylammonium salt represented by Formula (1) is from 0.0001 to 10 mass %.

3. The treatment liquid for etching a transition metal on a semiconductor wafer according to claim 1, further comprising (C) at least one ammonium ion selected from the group consisting of tetramethylammonium ion, ethyltrimethylammonium ion, tetraethylammonium ion, tetrapropylammonium ion, and tetrabutylammonium ion.

4. The treatment liquid for etching a transition metal on a semiconductor wafer according to claim 1, wherein the (A) hypohalite ion is a hypohalite ion, and the pH at 25° C. is from more than 7 to less than 14.0.

5. The treatment liquid for etching a transition metal on a semiconductor wafer according to claim 1, wherein the transition metal on the semiconductor wafer is a Group 6 metal or ruthenium.

6. The treatment liquid for etching a transition metal on a semiconductor wafer according to claim 1, further comprising a chloride ion.

7. The treatment liquid for etching a transition metal on a semiconductor wafer according to claim 1, further comprising a chlorate ion.

8. The treatment liquid for etching a transition metal on a semiconductor wafer according to claim 1, wherein the concentration of metal contained in the treatment liquid for semiconductor wafers is 1 ppb or less by mass.

9. A method of etching, comprising a step of bringing a semiconductor wafer into contact with the treatment liquid for etching a transition metal on a semiconductor wafer according to claim 1.

10. A treatment liquid for etching a transition metal on a semiconductor wafer, the treatment liquid comprising:
(A) a hypohalite ion; and
(B) an alkylammonium salt represented by the following Formula (1)
wherein the hypohalite ions are hypochlorite ions and hypobromite ions, and the concentration of hypochlorite ions is from 0.05 to 20.0 mass %, and the concentration of hypobromite ions is from 0.0096 to 1.92 mass %,

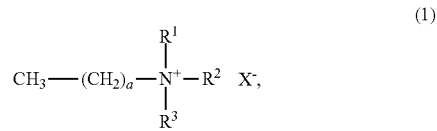

wherein a is an integer from 6 to 20, $R^1$, $R^2$, and $R^3$ are independently a hydrogen atom or an alkyl group having carbon number from 1 to 20, and $X^-$ is a bromine-containing ion.

* * * * *